US012685059B2

(12) United States Patent
Hu et al.

(10) Patent No.: US 12,685,059 B2
(45) Date of Patent: Jul. 14, 2026

(54) SEMICONDUCTOR DEVICE AND METHOD OF FORMING THE SAME

(71) Applicant: Taiwan Semiconductor Manufacturing Co., Ltd., Hsinchu (TW)

(72) Inventors: Po-Wei Hu, New Taipei City (TW); Po-Chin Nien, Taipei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 911 days.

(21) Appl. No.: 17/739,783

(22) Filed: May 9, 2022

(65) Prior Publication Data

US 2023/0154762 A1 May 18, 2023

Related U.S. Application Data

(60) Provisional application No. 63/266,113, filed on Dec. 29, 2021, provisional application No. 63/278,579, filed on Nov. 12, 2021.

(51) Int. Cl.
| | |
|---|---|
| *H01L 21/321* | (2006.01) |
| *H01L 21/306* | (2006.01) |
| *H01L 21/67* | (2006.01) |
| *H01L 21/768* | (2006.01) |
| *H10D 64/01* | (2025.01) |

(52) U.S. Cl.
CPC .... *H01L 21/3212* (2013.01); *H01L 21/30625* (2013.01); *H01L 21/67092* (2013.01); *H01L 21/7684* (2013.01); *H10D 64/017* (2025.01)

(58) Field of Classification Search
CPC ............. H01L 21/3212; H01L 21/0209; H01L 21/30625; H01L 21/02057; H01L 21/02016
See application file for complete search history.

(56) References Cited

U.S. PATENT DOCUMENTS

| | | | |
|---|---|---|---|
| 9,184,042 B1 * | 11/2015 | Bergendahl ....... | H01L 21/02016 |
| 10,949,447 B2 | 3/2021 | Wang et al. | |
| 2013/0020682 A1 * | 1/2013 | Clark .................... | H01L 21/311 |
| | | | 257/E29.022 |
| 2018/0151387 A1 | 5/2018 | Liu et al. | |
| 2020/0105909 A1 * | 4/2020 | Wu ..................... | H01L 29/7843 |
| 2020/0135641 A1 * | 4/2020 | Lee .................... | H01L 21/76825 |
| 2021/0257293 A1 * | 8/2021 | Lee .................... | H01L 21/76832 |
| 2022/0013364 A1 | 1/2022 | Chang et al. | |

FOREIGN PATENT DOCUMENTS

| | | |
|---|---|---|
| CN | 113451209 A | 9/2021 |
| TW | 202002587 A | 1/2020 |

* cited by examiner

*Primary Examiner* — Zandra V Smith
(74) *Attorney, Agent, or Firm* — Slater Matsil, LLP

(57) ABSTRACT

A method of forming a semiconductor device is provided. The method includes forming a first film over an active region of a first side of a semiconductor substrate and a second film over a second side of the semiconductor substrate opposing to the first side of the semiconductor substrate; applying a chemical mechanical polishing to remove at least a portion of the second film; after the chemical mechanical polishing, forming a photoresist layer over the first film; and patterning the photoresist layer using an extreme ultraviolet radiation.

20 Claims, 26 Drawing Sheets

SEMICONDUCTOR DEVICE AND METHOD OF FORMING THE SAME

PRIORITY CLAIM AND CROSS-REFERENCE

This application claims the benefit of U.S. Provisional Application No. 63/278,579, filed on Nov. 12, 2021, entitled "Backside CMP for Backside Defect Reduction for EUV Chuck Protection and Non-correctable error/Overlay Improvement," and U.S. Provisional Application No. 63/266,113, filed on Dec. 29, 2021, entitled "Backside CMP for Backside Defect Reduction for EUV Chuck Protection and Non-Correctable Error/Overlay Improvement," which are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
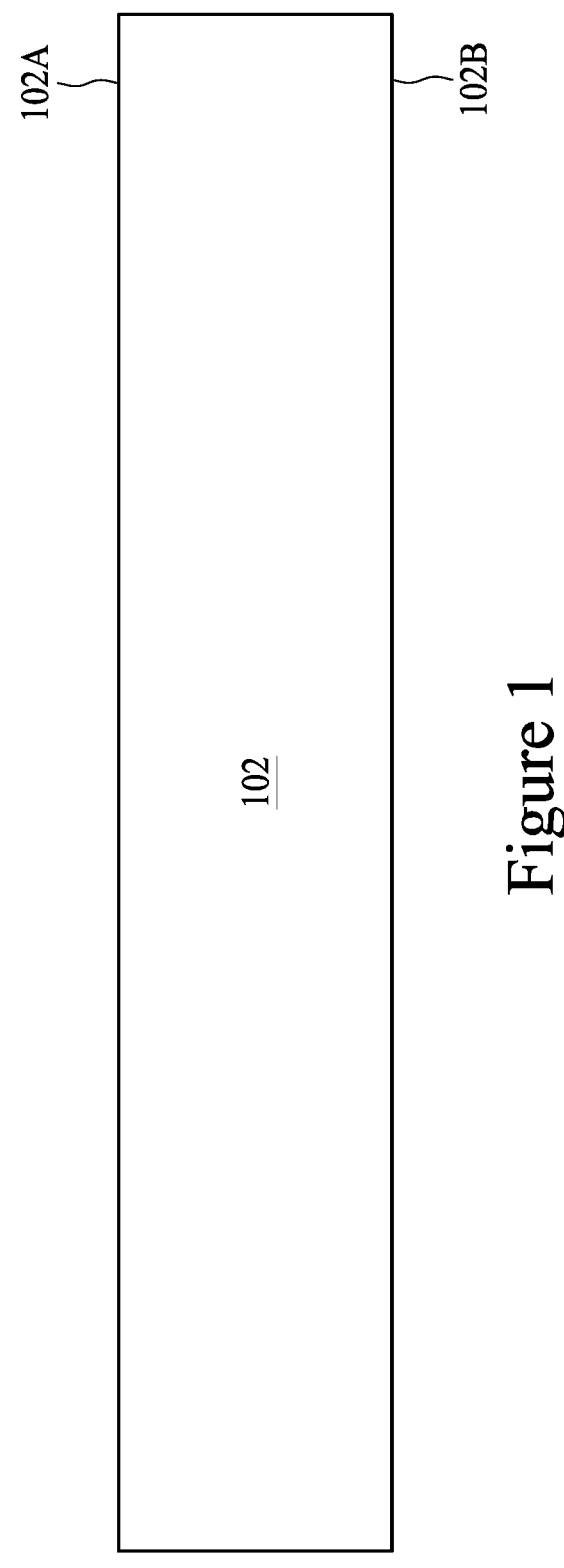
FIGS. 1-5 illustrate cross-sectional views of intermediate stages in the manufacturing of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As discussed below, embodiments illustrated in this disclosure provide methods of forming a semiconductor device with the use of extreme ultraviolet (EUV) lithography techniques and the semiconductor device formed thereof. Before applying the EUV lithography to a frontside film of a substrate for forming features of the semiconductor device, a backside film may be formed over a backside of the substrate and may be planarized and cleaned by a backside planarization process, such as a backside chemical mechanical polishing (CMP). The backside planarization allows a EUV chuck to contact the planarized surface of the backside film for supporting the substrate to perform the EUV lithography. Substrate deformation and/or unexpected topography variances of the frontside film or a photoresist layer over it, caused by the EUV chuck contacting an uneven surface of backside film, may be thus reduced or prevented. Manufacturing yields of the EUV lithography may be improved.

FIG. 1 illustrates an example of a method of forming a semiconductor device 100, in accordance with some embodiments. In some embodiments, a substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed over an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 102 has a frontside 102A and a backside 102B. In some embodiments, the frontside 102A is an active side that allows devices to be formed thereon.

Figure 2:
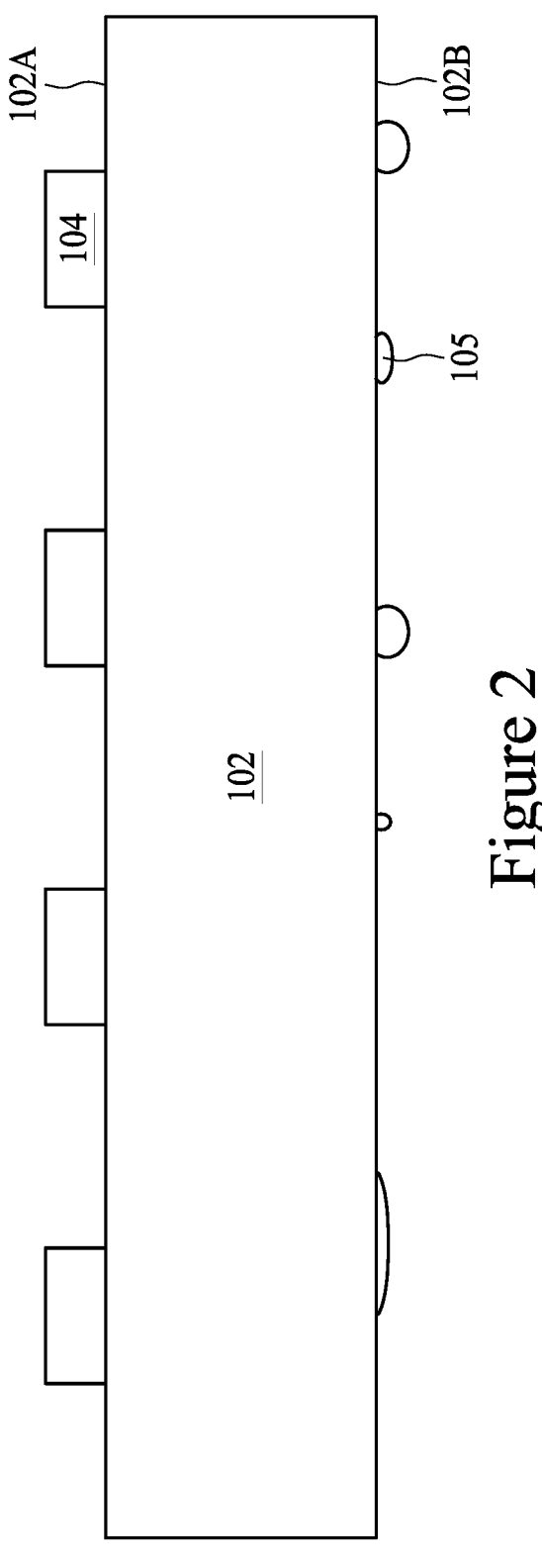

In FIG. 2, a frontside film 104 may be formed over the frontside 102A of the substrate 102. In some embodiments, the frontside film 104 may include one or more layers and may be patterned by an etch process. In some embodiments, the frontside film 104 may be active features of the semiconductor device 100. In some embodiments, the frontside film 104 may be a mask used for transferring a pattern to underlying layers and may be removed after the pattern is transferred. For example, in embodiments for forming Fin- FETs, the frontside film 104 may include semiconductor fins, a hard mask for forming the semiconductor fins, or a hard mask used for patterning other features of the FinFETs. The frontside film 104 may be formed by depositing a material by a deposition process, such as chemical vapor deposition (CVD), high-density plasma CVD (HDP-CVD), flowable CVD, physical vapor deposition (PVD), sputtering, and etching the deposited material by an etch process, such as a wet etching or a dry etching. In some embodiments, the etch process may leave contaminants 105 (e.g., particles or scratches), from the etched portions of the frontside film 104, etchants, or any derivatives, attached on the backside 102B of the substrate 102.

Figure 3:
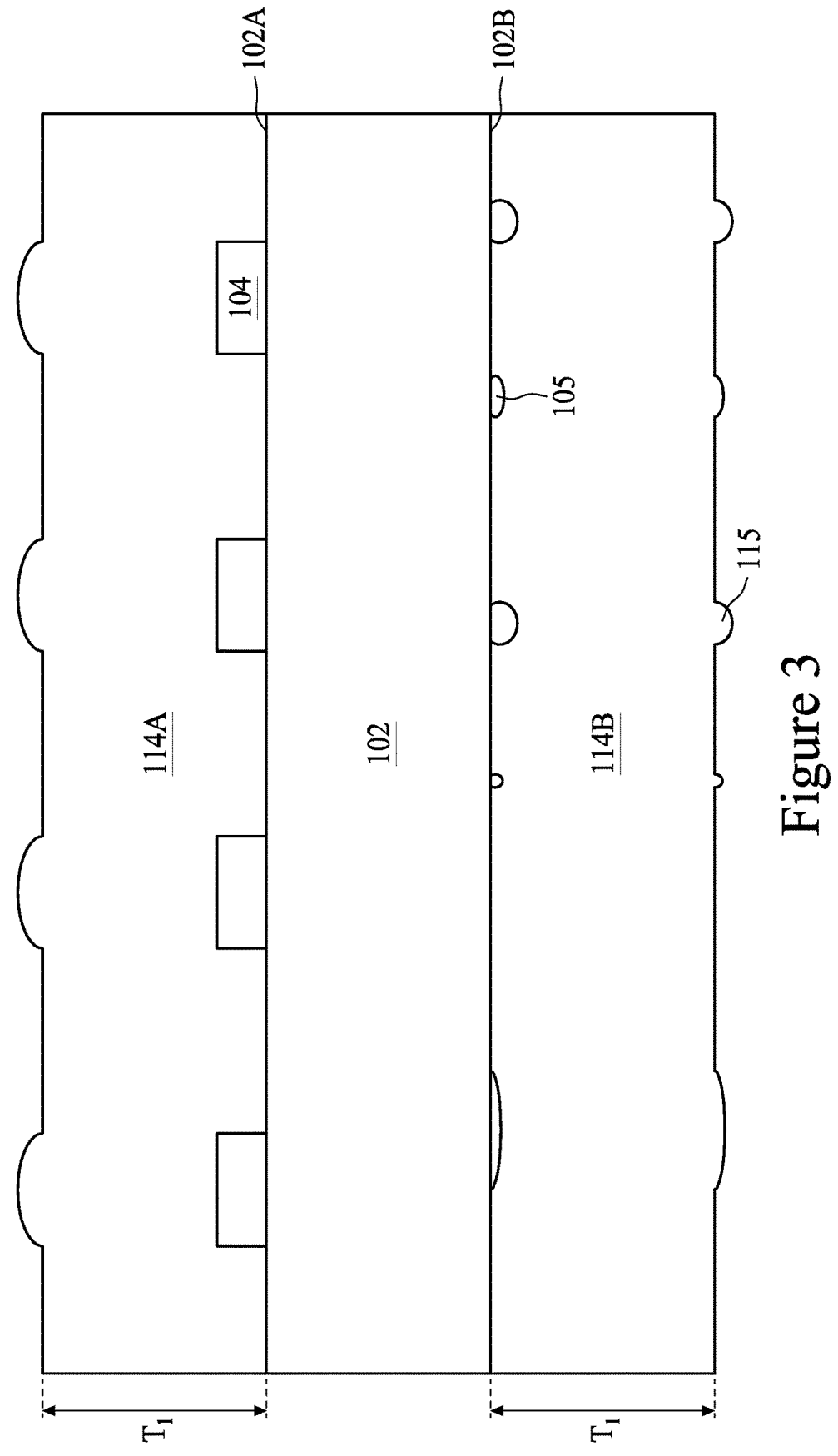

In FIG. 3, a frontside film 114A and a backside film 114B are formed over the frontside 102A of substrate 102 (e.g., over the frontside film 104) and the backside of 102B of substrate 102, respectively, in accordance with some embodiments. In some embodiments, the frontside film 114A and the backside film 114B are formed in a same process, such as thermal growth process, atomic layer deposition (ALD), or other suitable methods that deposit or grow films in a furnace or in a tool that allow films to be formed over both sides of a substrate. The frontside film 114A and the backside film 114B may include one or more layers. In some embodiments, the frontside film 114A and the backside film 114B may include polycrystalline silicon (polysilicon), polycrystalline silicon-germanium, or other suitable semiconductor materials. In some embodiments, the frontside film 114A and the backside film 114B have a same thickness $T_1$. The thickness $T_1$ may be in a range of about 1000 angstroms to about 2500 angstroms, or about 1500 angstroms to about 2000 angstroms. In some embodiments, the thickness $T_1$ is about 1800 angstroms.

In some embodiments, the frontside film 114A is conformally deposited over the frontside film 104 or other features of the semiconductor device 100, thereby having an uneven top surface. In some embodiments, the backside film 114B is conformally deposited over the contaminants 105 so that it may have an uneven top surface, such as having humps or protrusions 115 on its surface.

Figure 4:
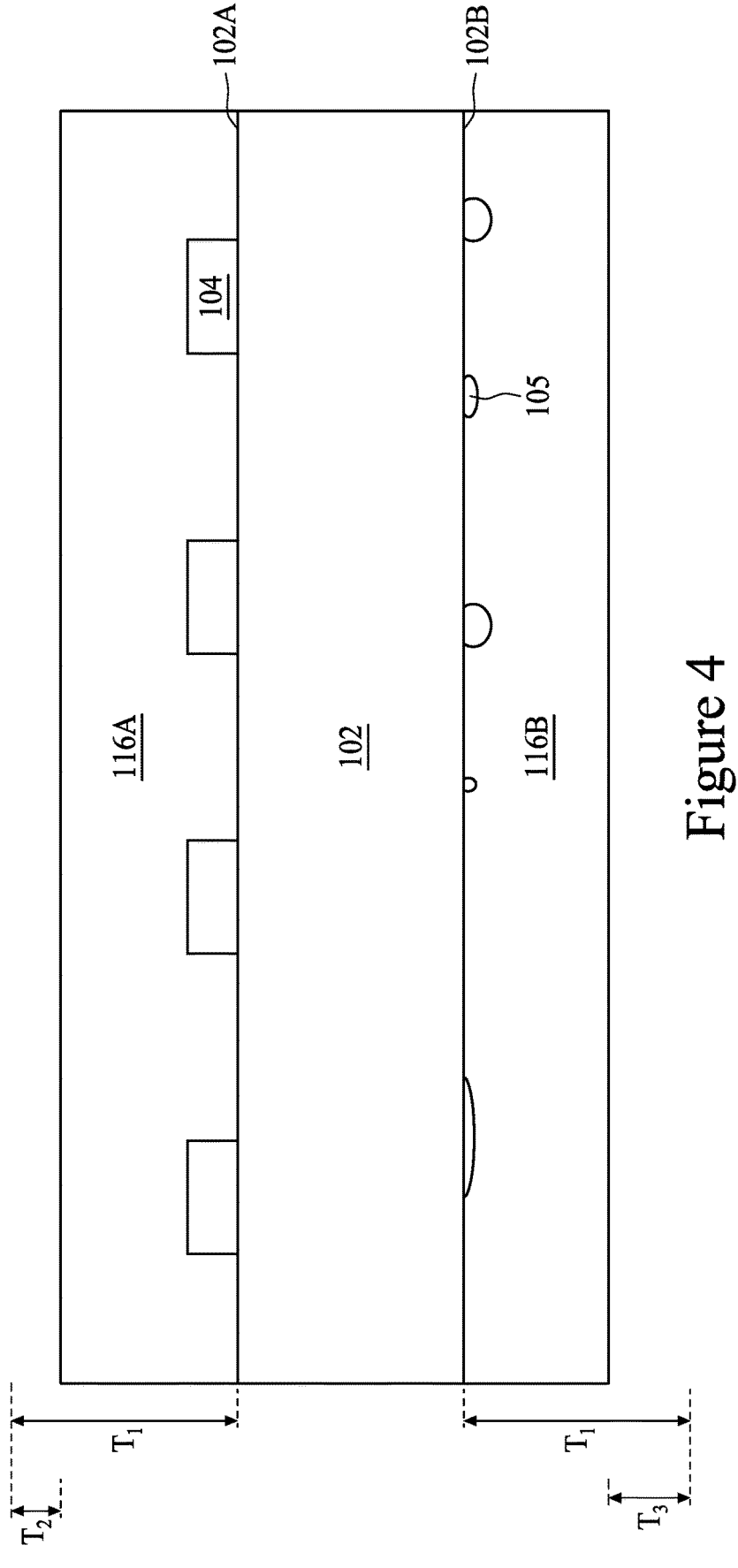

In FIG. 4, in some embodiments where the frontside film 114A has an uneven top surface, the frontside film 114A is planarized by, for example, a frontside CMP, thereby forming a frontside film 116A. A photoresist layer 118 of a EUV lithography process may then be formed over the planar top surface of the frontside film 114A in subsequent stages (see below, FIG. 5). In some embodiments, a thickness $T_2$ of the frontside film 114A may be removed by the frontside CMP to achieve the planar top surface of the frontside film 116A. In some embodiments, the backside film 114B is planarized by, for example, a backside CMP, thereby forming a backside film 116B. The backside film 116B may have a planar top surface so as to facilitate a EUV chuck 120 (see below, FIG. 5) to support the substrate 102 for performing the EUV lithography process in subsequent stages. For example, a thickness $T_3$ of the backside film 114B may be removed by the backside CMP to achieve the planar top surface, such as completely or substantially removing the humps or protrusions 115. In some embodiments, the thickness $T_2$ removed from the frontside film 114A is about 30% to about 70% of the thickness $T_1$ of the backside film 114B, and the thickness $T_3$ removed from the backside film 114B is about 10% to about 95% of the thickness $T_1$ of the backside film 114B. The thicknesses $T_2$ and $T_3$ may be adjusted by advanced process control (APC), which may feedback the appropriate thicknesses $T_2$ and $T_3$ according to the analysis of various data collected in subsequent manufacturing stages by advanced process control software. In some embodiments, the thickness $T_3$ removed from the backside film 114B may be greater than the thickness $T_2$ removed from the frontside film 114A. A narrow range of the thickness $T_2$ is allowed to be removed because the frontside film 116A may have thickness requirements (e.g., gate height of a transistor) for being active features of the semiconductor device 100, while the backside film 116B has no such concerns. A greater extent of the thickness $T_3$ may be removed to make sure that the backside film 116B have sufficient surface flatness and cleanness in the subsequent EUV lithography processes. For example, the surface roughness (Ra) of the backside film 116B is about 5 angstroms to about 100 angstroms, or less than about 20 angstroms, in accordance with some embodiments.

Figure 5:
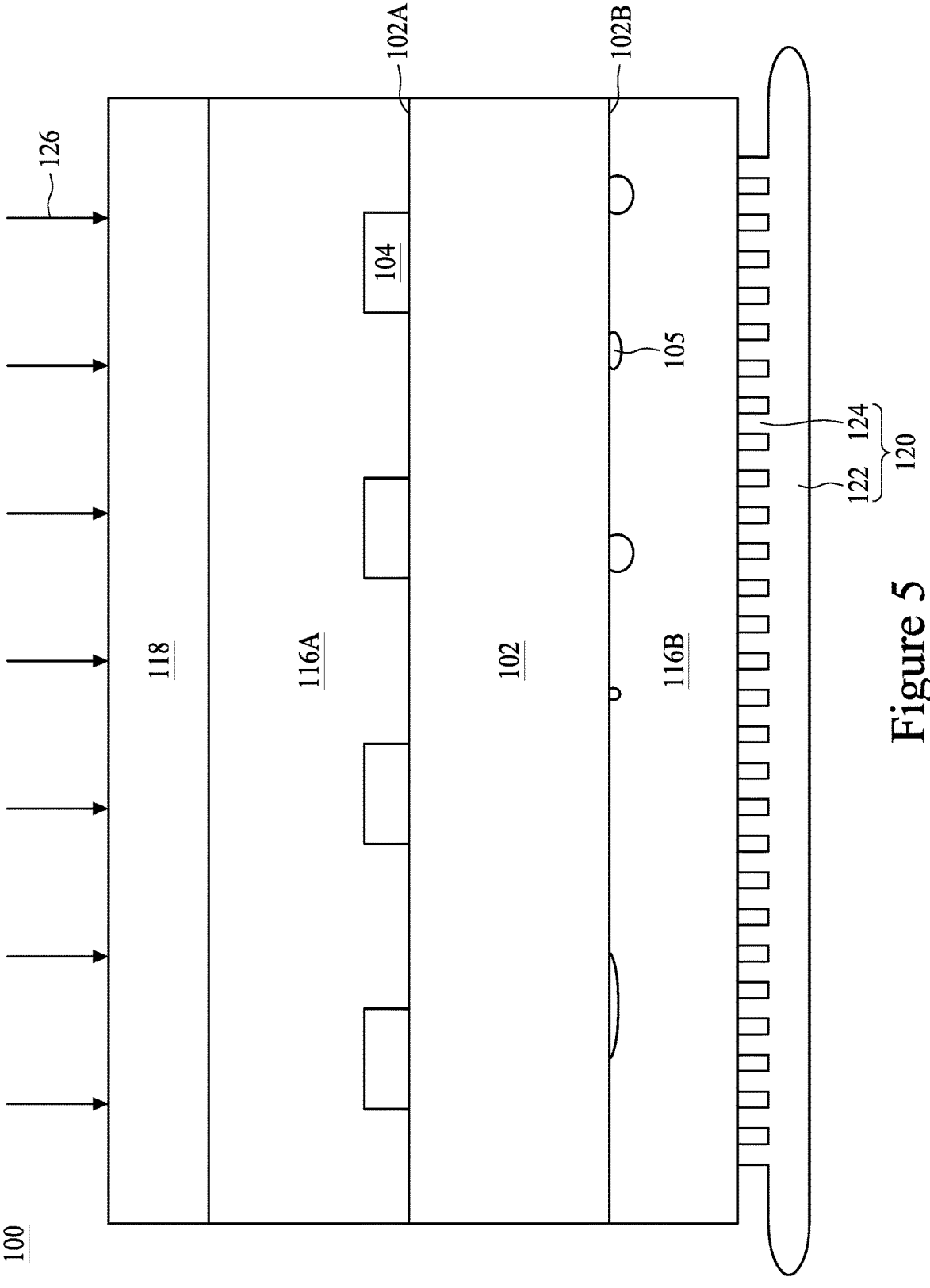

In FIG. 5, a photoresist layer 118 for the EUV lithography process is deposited over the frontside film 116A, in accordance with some embodiments. In the EUV lithography process, a EUV chuck 120 may be disposed over the backside 102B of the substrate 102 to support the substrate 102. The EUV chuck 120 may include a base element 122 and a plurality of pins 124 standing on the based element. In some embodiments, the plurality of pins 124 contacts the top surface of the backside film 116B to jack up the substrate 202 for performing the EUV lithography process. In some embodiments, the EUV lithography process uses an extreme violet radiation 126 having a wavelength of about 11 nm to about 14 nm, such as about 13.5 nm, to irradiate the photoresist layer 118 so as to define a pattern in the photoresist layer 118. In some embodiments, the plurality of pins 124 contacts the top surface of the backside film 116B to jack up the substrate 202 for performing the EUV lithography process. In some embodiments, substrate deformation and/or unexpected topography variances of the photoresist layer 118, caused by the EUV chuck 120 jacking up the humps or protrusions 115 on the top surface of the backside film 116B, may be reduced or prevented because the top surface of the backside film 116B is planarized and cleaned by the backside CMP. As such, the EUV lithography process may have reduced overlay errors and improved yield. Also, the risks that the pins 124 of EUV chuck 120 suffer extra stress and thus are damaged or broken by contacting or jacking up the humps or protrusions 115 on the backside film 116B may be reduced or eliminated. A lifetime of the EUV chuck 120 may be extended.

Figure 6:
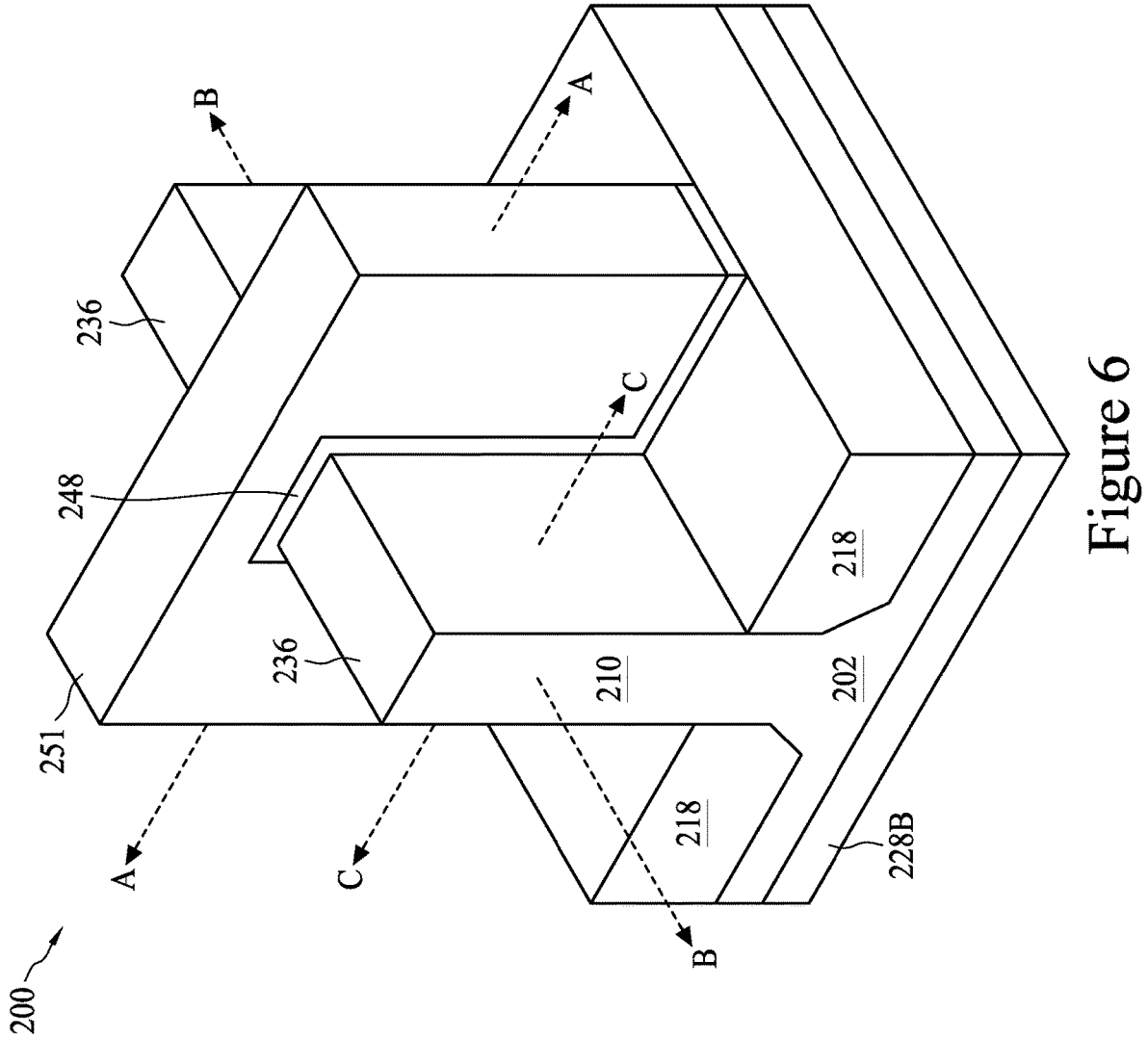
FIG. 6 illustrates an example of a FinFET in a three-dimensional view, in accordance with some embodiments.

FIGS. 6 to 24B illustrate an embodiment of forming fin field-effect transistors (FinFETs) 200. FIG. 6 illustrates an example of a FinFET 200 in a three-dimensional view, in accordance with some embodiments. The FinFET 200 comprises a fin 210 over a frontside of a substrate 202 (e.g., a semiconductor substrate). Isolation regions 218 are disposed in the substrate 202, and the fin 210 protrudes above and from between neighboring isolation regions 218. Although the isolation regions 218 are described/illustrated as being separate from the substrate 202, as used herein, the term "substrate" may be used to refer to just the semiconductor substrate or a semiconductor substrate inclusive of isolation regions. Additionally, although the fin 210 is illustrated as a single, continuous material as the substrate 202, the fin 210 and/or the substrate 202 may comprise a single material or a plurality of materials. In this context, the fin 210 refers to the portion extending between the neighboring isolation regions 218.

A gate dielectric layer 248 is along sidewalls and over a top surface of the fin 210, and a gate electrode 251 is over the gate dielectric layer 248. Source/drain regions 236 are disposed in opposite sides of the fin 210 with respect to the gate dielectric layer 248 and gate electrode 251. Also, as will be discussed in greater below, a backside film 228B is formed over a backside of the substrate 202. FIG. 6 further illustrates reference cross-sections that are used in later figures. Cross-section A-A is along a longitudinal axis of the gate electrode 251 and in a direction, for example, perpendicular to the direction of current flow between the source/drain regions 236 of the FinFET. Cross-section B-B is perpendicular to cross-section A-A and is along a longitudinal axis of the fin 210 and in a direction of, for example, a current flow between the source/drain regions 236 of the FinFET. Cross-section C-C is parallel to cross-section A-A and extends through a source/drain region of the FinFET. Subsequent figures refer to these reference cross-sections for clarity. Embodiments of FinFETs described here are in a particular context. Various embodiments may be applied, however, such as other types of transistors (e.g., gate-all-around FETs, planar FETs, or the like) in lieu of or in combination with the FinFETs.

FIGS. 7 through 24B are cross-sectional views of intermediate stages in the manufacturing of FinFETs 200, in accordance with some embodiments. FIGS. 7 through 15 illustrate reference cross-section A-A illustrated in FIG. 6, except for multiple fins/FinFETs. FIGS. 16A, 17A, 18A, 19A, 20A, 21A, 22A, 23A, and 24A are illustrated along reference cross-section A-A illustrated in FIG. 6, and FIGS. 16B, 17B, 18B, 19B, 20B, 21B, 22B, 23B, and 24B are illustrated along a similar cross-section B-B illustrated in FIG. 6, except for multiple fins/FinFETs. FIGS. 18C and 18D are illustrated along reference cross-section C-C illustrated in FIG. 6, except for multiple fins/FinFETs.

Figure 7:
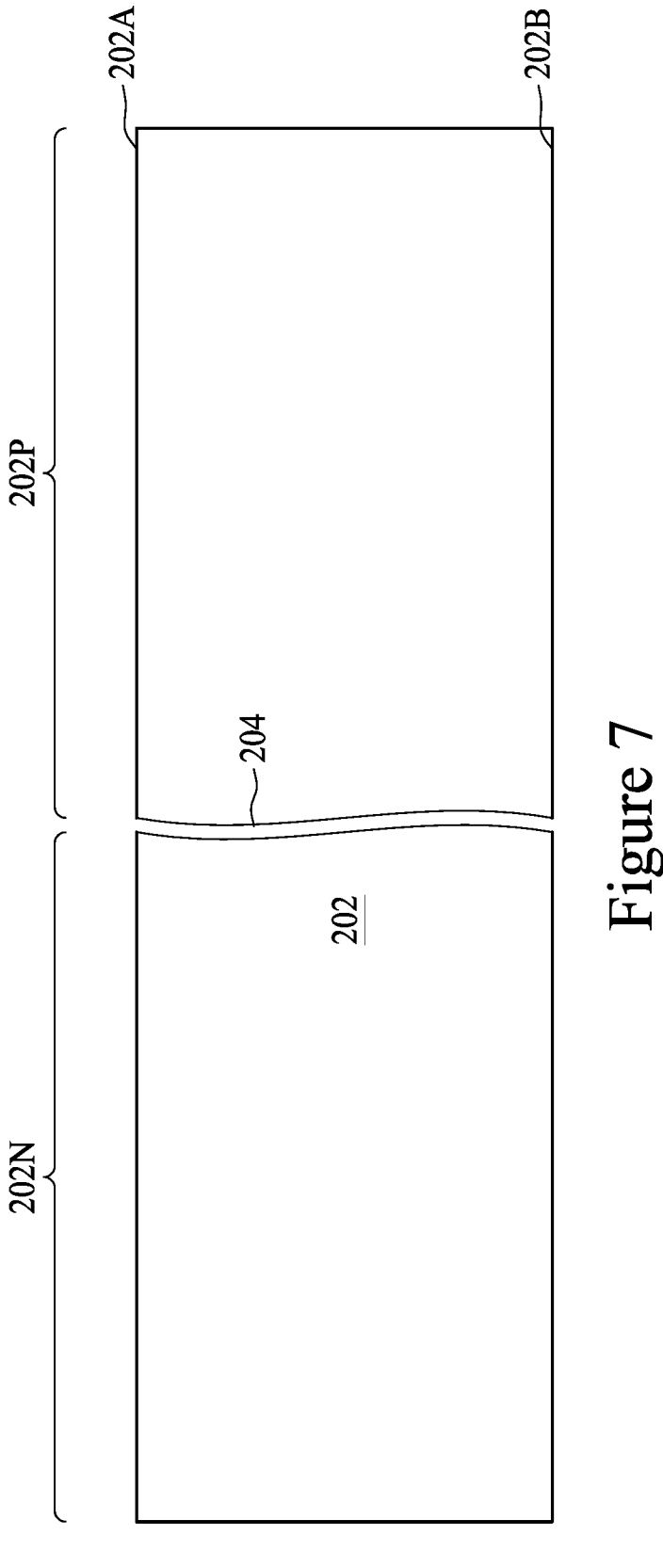
FIGS. 7, 8, 9, 10, 11, 12, 13, 14, 15, 16A, 16B, 17A, 17B, 18A, 18B, 18C, 18D, 19A, 19B, 20A, 20B, 21A, 21B, 22A, 22B, 22C, 23A, 23B, 24A, and 24B are cross-sectional views of intermediate stages in the manufacturing of Fin-FETs, in accordance with some embodiments.

In FIG. 7, a substrate 202 is provided, in accordance with some embodiments. The substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided over a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate 202 has a frontside 202A and a backside 202B.

The substrate 202 has a region 202N and a region 202P. The region 202N can be for forming n-type devices, such as NMOS transistors, e.g., n-type FinFETs. The region 202P can be for forming p-type devices, such as PMOS transistors, e.g., p-type FinFETs. The region 202N may be physically separated from the region 202P (as illustrated by divider 204), and any number of device features (e.g., other active devices, doped regions, isolation structures, etc.) may be disposed between the region 202N and the region 202P.

Figure 8:
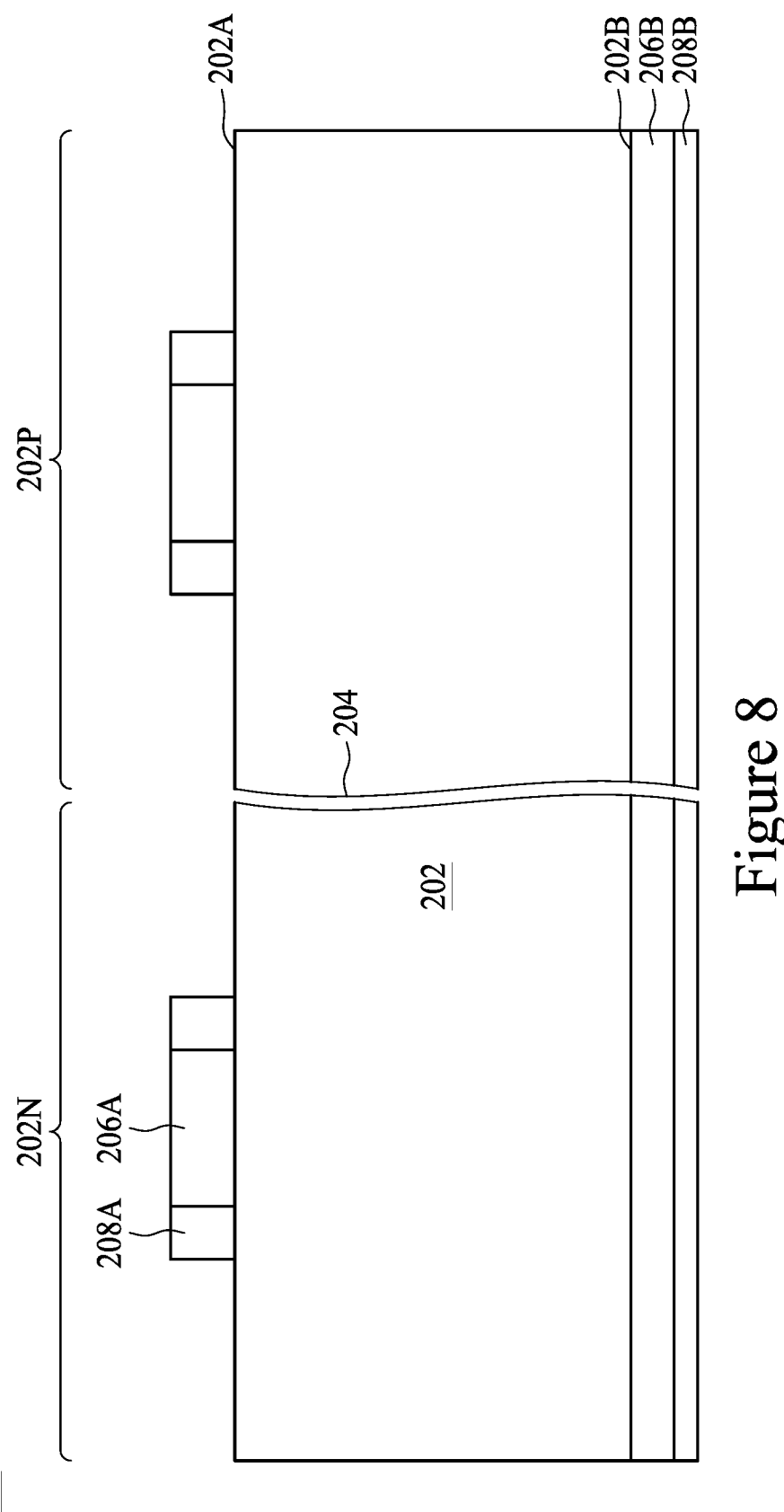

In FIG. 8, masks for forming the fins 210 (see below, FIG. 9) are formed over the frontside 202A of the substrate 202, in accordance with some embodiments. The masks may be patterned by any suitable method. For example, the masks may be patterned using one or more lithography processes, including double-patterning or multi-patterning processes.

Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer 206A is formed over the frontside 202A of the substrate 202 and patterned using a single lithography process. Spacers 208A are formed alongside the sacrificial layer 206A using a self-aligned process. The sacrificial layer 206A is then removed, and the remaining spacers 208A may then be used to transfer the pattern to the fins 210.

In some embodiments, the sacrificial layer 206A includes polysilicon, polycrystalline silicon germanium, or other suitable semiconductor materials. In some embodiments, to achieve good film qualities, the sacrificial layer 206A may be formed by a thermal growth process. For example, in the thermal growth process, the substrate 202 (e.g., wafer) may be inserted into a furnace, where both the frontside 202A and backside 202B of the substrate 202 are exposed, and films may be deposited both over the frontside 202A and backside 202B of the substrate 202. For example, the sacrificial layer 206A may be formed over the frontside 202A of the substrate 202, and a first backside film 206B may be formed over the backside 202B of the substrate 202, respectively, by the thermal growth process.

In some embodiments, the spacers 208A include silicon oxynitride, silicon oxide, silicon nitride, silicon oxygen carbon nitride, silicon carbon nitride, the like, or a combination thereof. The spacers 208A may be formed by ALD. For example, after the sacrificial layer 206A is formed, the substrate 202 (e.g., a wafer) is disposed in an ALD tool that allows ALD layers formed over both the frontside 202A and the backside 202B of the substrate 202, forming the spacers 208A alongside the sacrificial layer 206A and a second backside film 208B over the first backside film 206B. However, it is noted that the sacrificial layer 206A and/or the spacers 208A may be formed by any suitable deposition methods without forming a backside film over the backside 202B of the substrate 202, such as CVD, HDP CVD, sputtering, PVD, or the like, in accordance with some embodiments.

Figure 9:
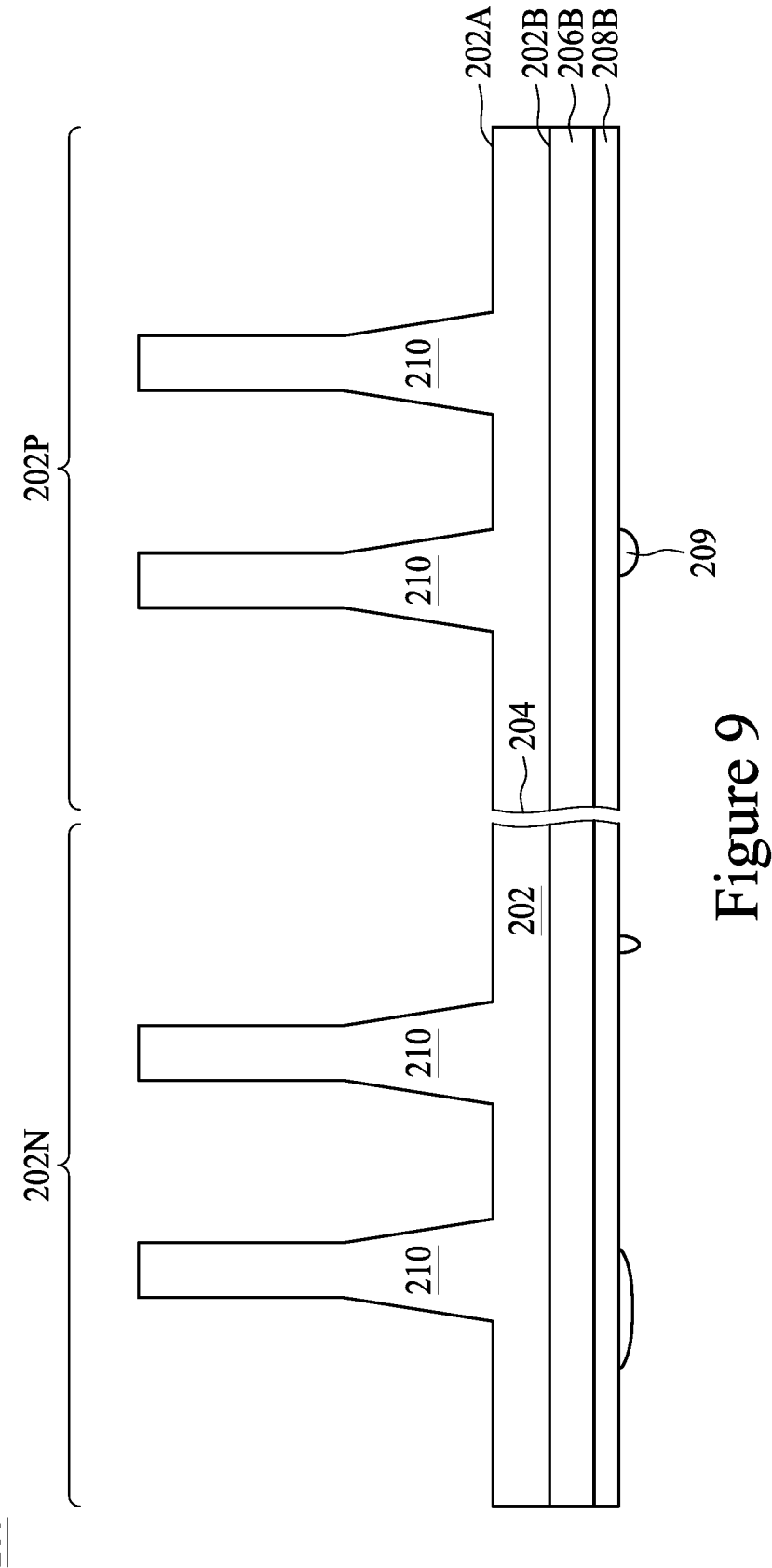

In FIG. 9, fins 210 are formed in the substrate 202. The fins 210 are semiconductor strips. In some embodiments, the fins 210 may be formed in the substrate 202 by etching trenches in the substrate 202. The etching may be any acceptable etch process, such as a reactive ion etch (RIE), neutral beam etch (NBE), the like, or a combination thereof. The etch process may be anisotropic and may apply to only one side of the substrate 202, such as the frontside 202A. However, in some embodiments, although the second backside film 208B is not etched, the etch process may leave contaminants 209, which may be from etched portions of the substrate 202, an etchant, or any derivatives, attached on the surface of the second backside film 208B or the surface of the outermost film over the backside 202B of the substrate 202. In some embodiments, the contaminants 209 may come from any processes of manufacturing the FinFETs 200 and may accumulate after more manufacturing processes are performed.

Figure 10:
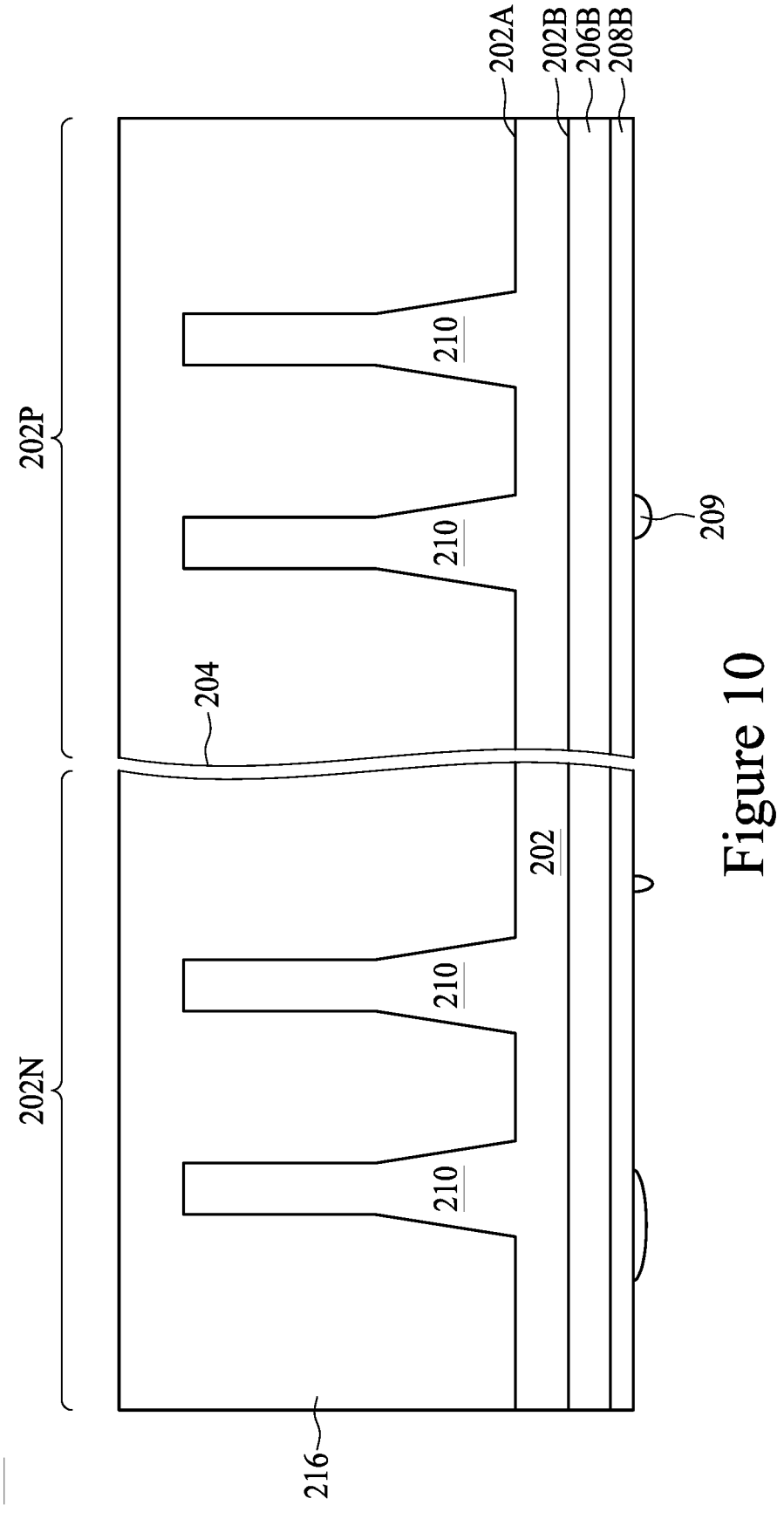

In FIG. 10, an insulation material 216 is formed over the substrate 202 and between neighboring fins 210. The insulation material 216 may be an oxide, such as silicon oxide, a nitride, the like, or a combination thereof, and may be formed by HDP-CVD, a flowable CVD (FCVD) (e.g., a CVD-based material deposition in a remote plasma system and post-curing to make it convert to another material, such as an oxide), the like, or a combination thereof. Other insulation materials formed by any acceptable process may be used. In the illustrated embodiment, the insulation material 216 is silicon oxide formed by a FCVD process. An anneal process may be performed once the insulation material is formed. In an embodiment, the insulation material 216 is formed such that excess insulation material 216 covers the fins 210. Although the insulation material 216 is illustrated as a single layer, some embodiments may utilize multiple layers. For example, in some embodiments, a liner (not shown) may first be formed along a surface of the substrate 202 and the fins 210. Thereafter, a fill material, such as those discussed above, may be formed over the liner.

Figure 11:
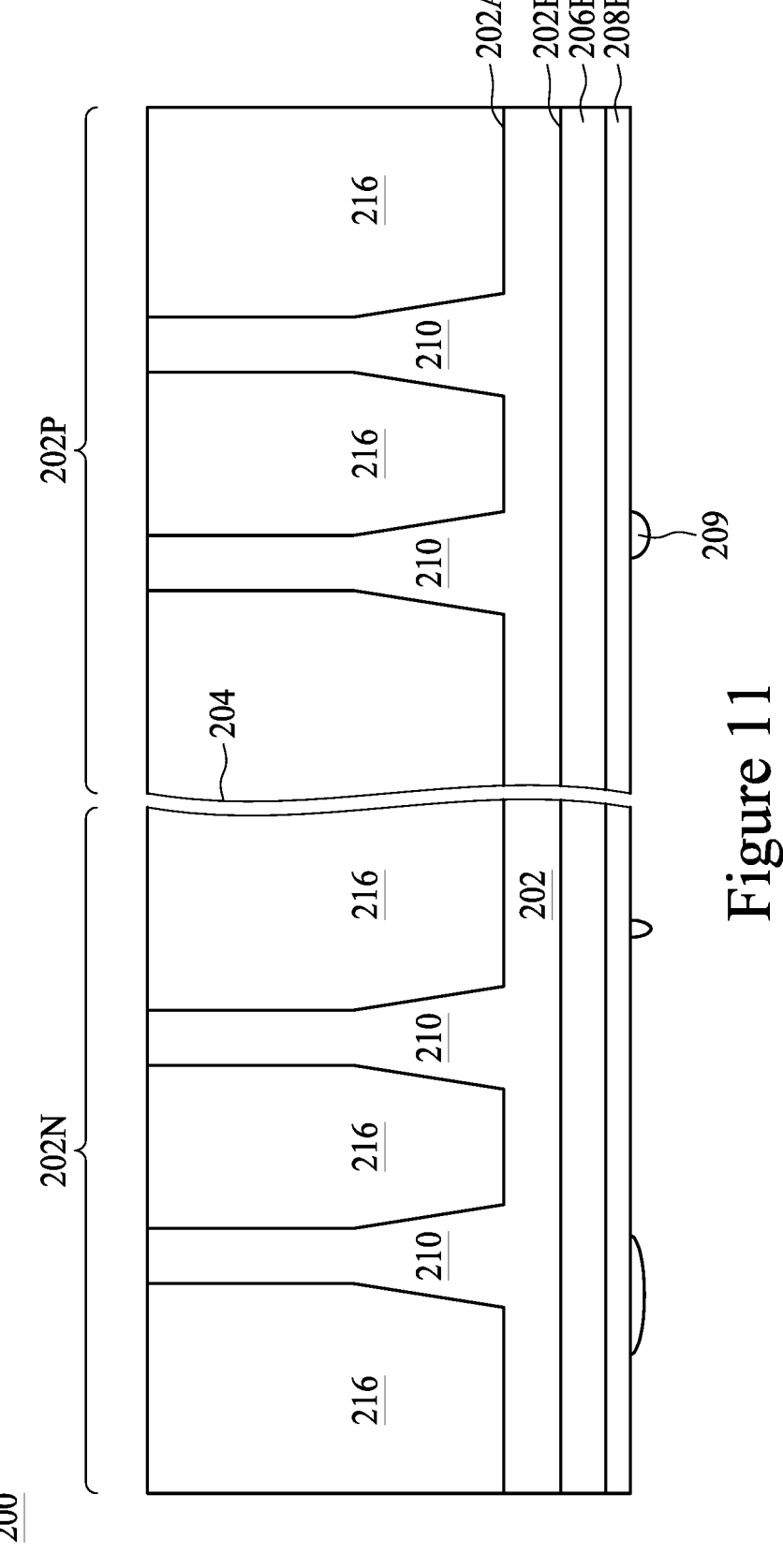

In FIG. 11, a removal process is applied to the insulation material 216 to remove excess insulation material 216 over the fins 210. In some embodiments, a planarization process such as a CMP, an etch-back process, combinations thereof, or the like may be utilized. The planarization process exposes the fins 210 such that top surfaces of the fins 210 and the insulation material 216 are level after the planarization process is complete.

Figure 12:
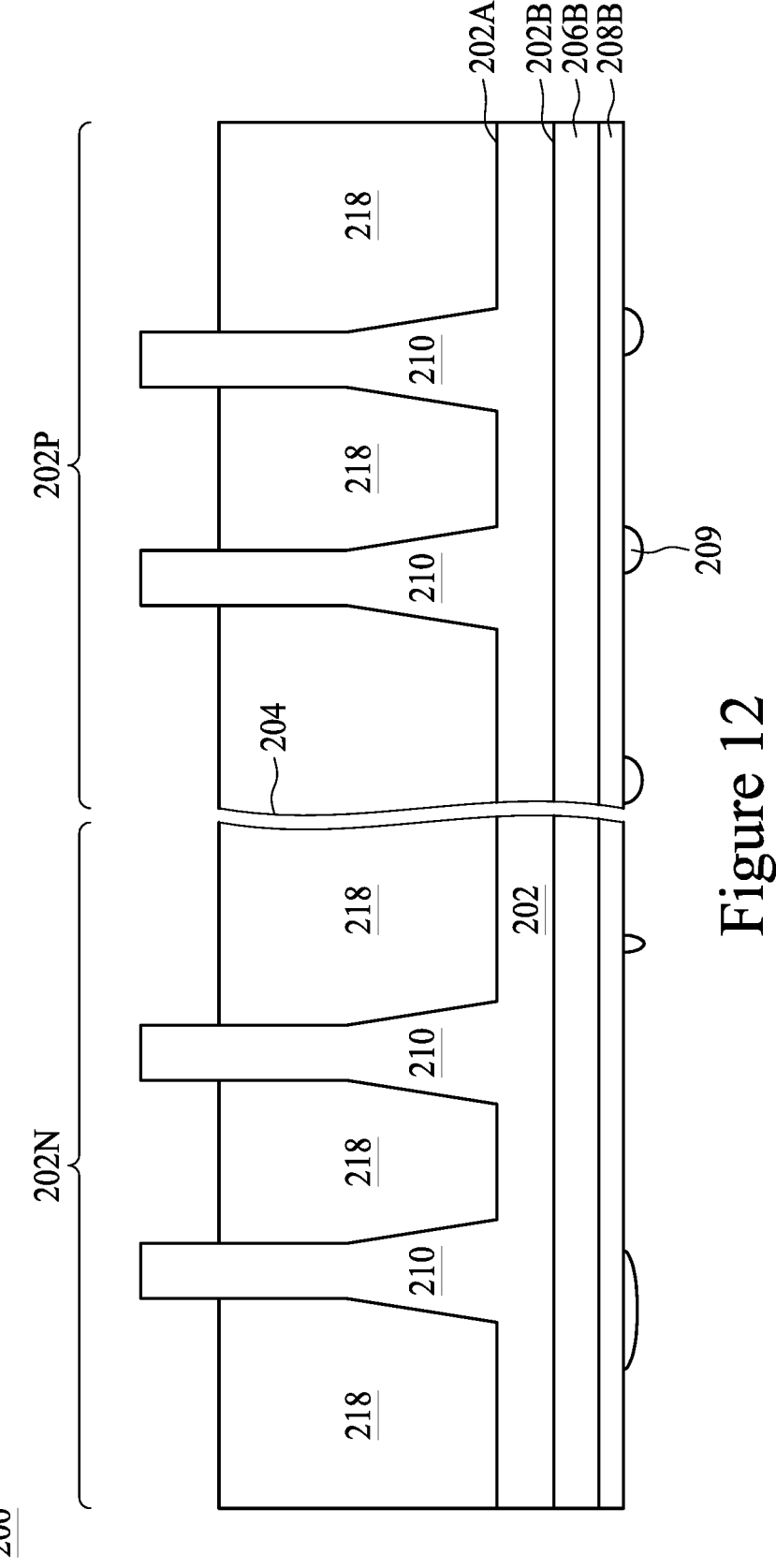

In FIG. 12, the insulation material 216 is recessed to form Shallow Trench Isolation (STI) regions 218. The insulation material 216 is recessed such that upper portions of fins 210 in the region 202N and in the region 202P protrude from between neighboring STI regions 218. Further, the top surfaces of the STI regions 218 may have a flat surface as illustrated, a convex surface, a concave surface (such as dishing), or a combination thereof. The top surfaces of the STI regions 218 may be formed flat, convex, and/or concave by an appropriate etch. The STI regions 218 may be recessed using an acceptable etching process, such as one that is selective to the material of the insulation material 216 (e.g., etches the material of the insulation material 216 at a faster rate than the material of the fins 210). For example, a chemical oxide removal with a suitable etch process using, for example, dilute hydrofluoric (dHF) acid may be used. In some embodiments, the etching processes discussed above may also leave some contaminants on the backside of the substrate (e.g., on the top surface of the backside film).

The process described with respect to FIGS. 7 through 12 is just one example of how the fins 210 may be formed. In some embodiments, the fins 210 may be formed by an epitaxial growth process. For example, a dielectric layer can be formed over a top surface of the substrate 202, and trenches can be etched through the dielectric layer to expose the underlying substrate 202. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 210. For example, the fins 210 in FIG. 11 can be recessed, and a material different from the fins 210 may be epitaxially grown over the recessed fins 210. In such embodiments, the fins 210 comprise the recessed material as well as the epitaxially grown material disposed over the recessed material. In an even further embodiment, a dielectric layer can be formed over a top surface of the substrate 202, and trenches can be etched through the dielectric layer. Heteroepitaxial structures can then be epitaxially grown in the trenches using a material different from the substrate 202, and the dielectric layer can be recessed such that the heteroepitaxial structures protrude from the dielectric layer to form the fins 210. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 202N (e.g., an NMOS region) different from the material in region 202P (e.g., a PMOS region). In various embodiments, upper portions of the fins 210 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductors include, but are not limited to, InAs, AlAs, GaAs, InP, GaN, InGaAs, InAlAs, GaSb, AlSb, AlP, GaP, and the like.

Further, in FIG. 12, appropriate wells (not shown) may be formed in the fins 210 and/or the substrate 202. In some embodiments, a P well may be formed in the region 202N, and an N well may be formed in the region 202P. In some embodiments, a P well or an N well are formed in both the region 202N and the region 202P.

In the embodiments with different well types, the different implant steps for the region 202N and the region 202P may be achieved using a photoresist or other masks (not shown). For example, a photoresist may be formed over the fins 210 and the STI regions 218 in the region 202N. The photoresist is patterned to expose the region 202P of the substrate 202, such as a PMOS region. The photoresist can be formed by using a spin-on technique and can be patterned using acceptable photolithography techniques. Once the photoresist is patterned, an n-type impurity implant is performed in the region 202P, and the photoresist may act as a mask to substantially prevent n-type impurities from being implanted into the region 202N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 202P, a photoresist is formed over the fins 210 and the STI regions 218 in the region 202P. The photoresist is patterned to expose the region 202N of the substrate 202, such as the NMOS region. The photoresist can be formed by using a spin-on technique and can be patterned using acceptable photolithography techniques. Once the photoresist is patterned, a p-type impurity implant may be performed in the region 202N, and the photoresist may act as a mask to substantially prevent p-type impurities from being implanted into the region 202P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 202N and the region 202P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 13:
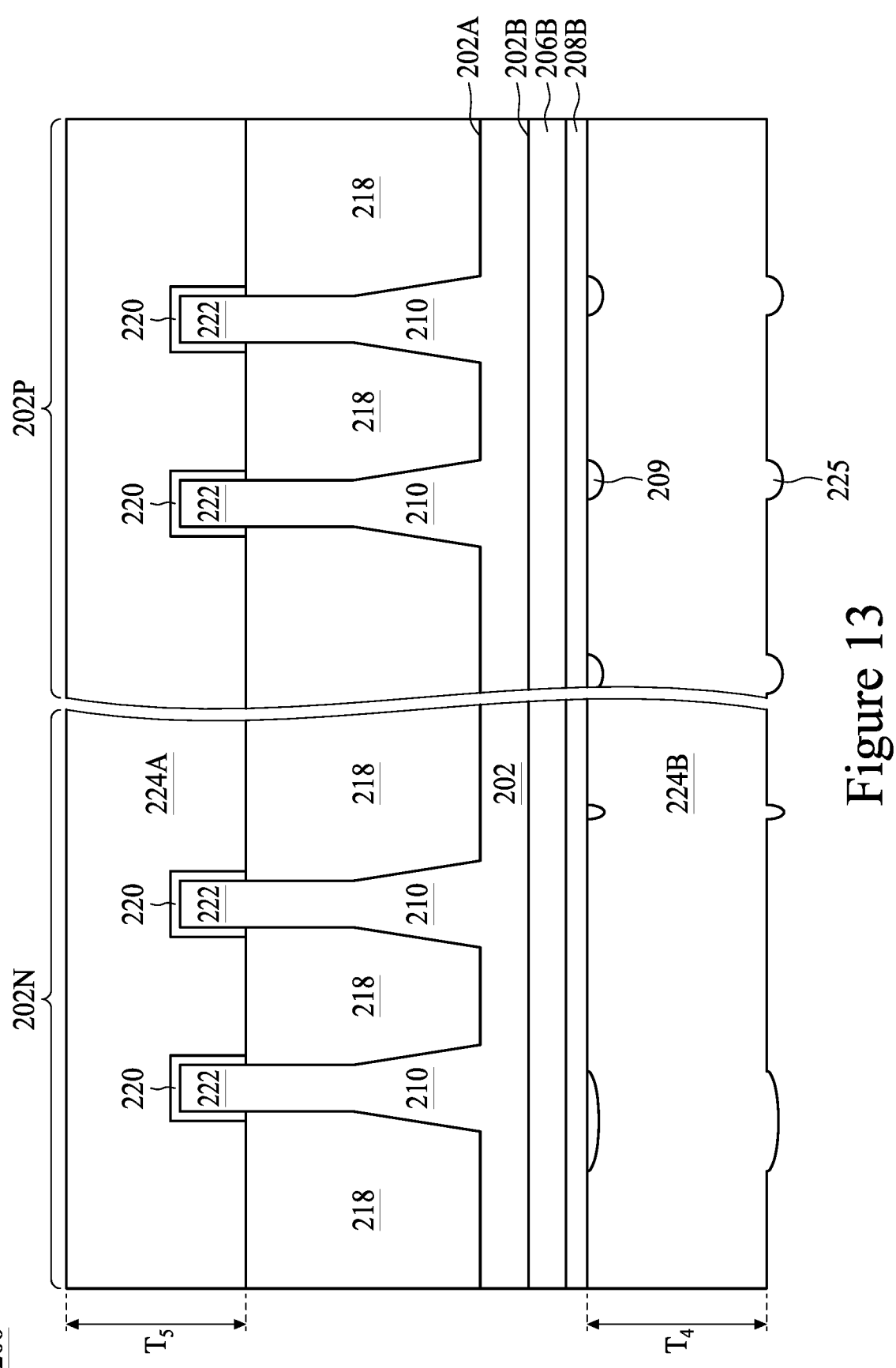

In FIG. 13, a dummy dielectric layer 220 is formed over the fins 210. The dummy dielectric layer 220 may be, for example, silicon oxide, silicon nitride, a combination thereof, or the like, and may be deposited or thermally grown according to acceptable techniques. Next, a dummy gate layer 224A is formed over the dummy dielectric layer 220, and a third backside film is 224B formed over the backside 202B of the substrate 202 (e.g., over the second backside film 208B), in accordance with some embodiments. For example, the dummy gate material and the third backside film 224B may be formed in a same process, such as the thermal growth process. For example, the dummy gate material and the third backside film 224B may have a same material selected from a group, including polysilicon, polycrystalline silicon germanium, or a combination. The dummy gate material and the third backside film 224B may have a same thickness $T_4$, such as about 1000 angstroms to about 2500 angstroms, or about 1500 angstroms to about 2000 angstroms. In some embodiments, the thickness $T_4$ is about 1800 angstroms.

In some embodiments, the dummy gate material and the third backside film 224B may be conformally deposited and thus may have top surfaces conformal to profiles of underlying features, such as the fins 210 and the contaminants 209, respectively. For example, as illustrated in FIG. 13, the third backside film 224B may have humps or protrusions 225 on its top surface. In some embodiments, the dummy gate material is further planarized, thereby forming the dummy gate layer 224A. The planarizing process may include a frontside CMP. In some embodiments, the dummy gate layer 224A may have a thickness $T_5$ of about 800 angstroms to about 1500 angstroms.

Figure 14:
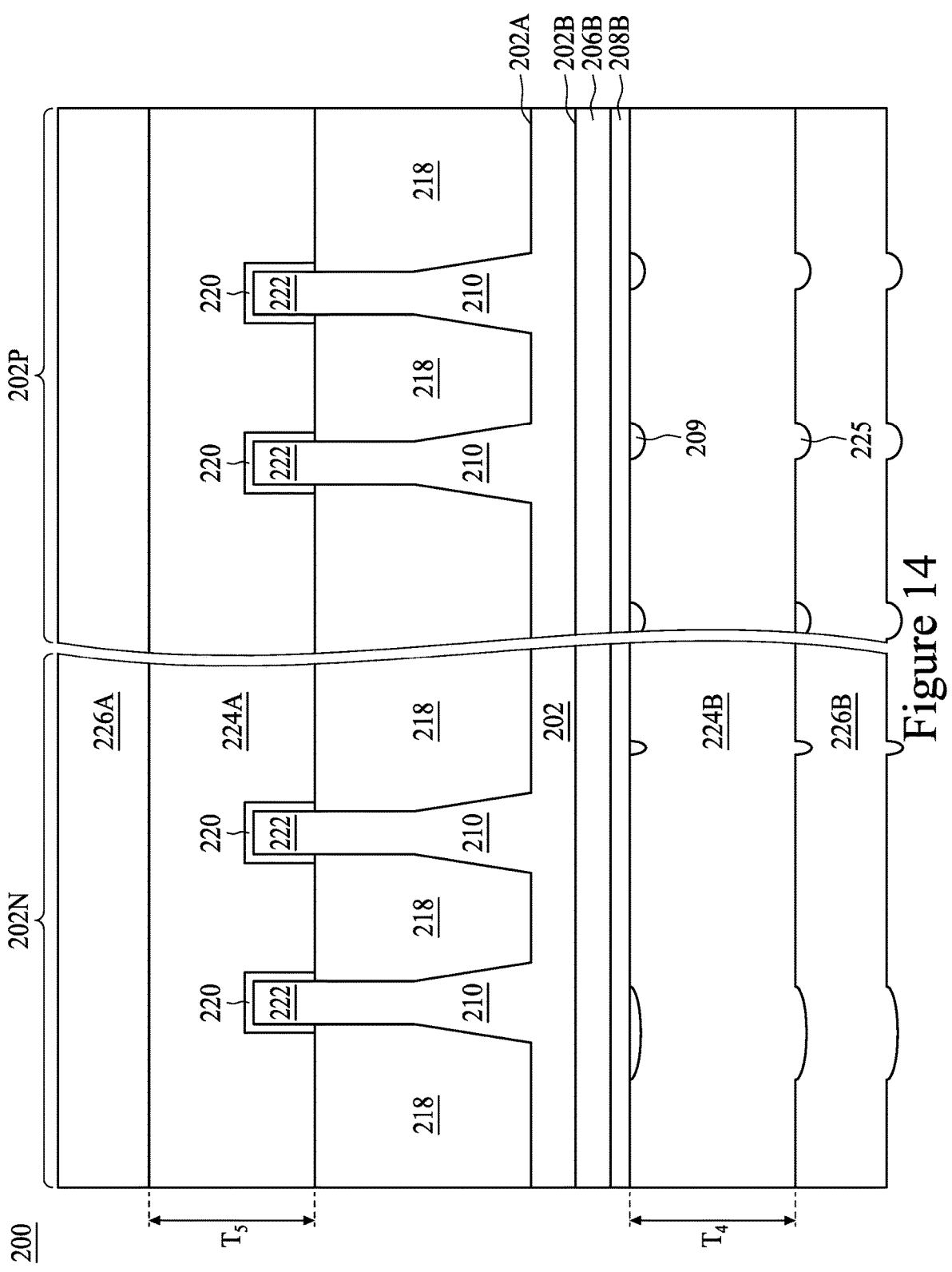

In FIG. 14, a mask layer 226A may be deposited over the dummy gate layer 224A, in accordance with some embodiments. The mask layer 226A may have a hardness greater than that of the dummy gate layer 224A for acting as a hard mask. The mask layer 226A may include, for example, silicon oxide, silicon oxynitride, silicon nitride, silicon carbide, silicon carbon nitride, titanium oxide, titanium nitride, the like, or a combination thereof. In some embodiments, the mask layer 226A may be formed by a thermal growth process, ALD, or a combination thereof, and a fourth backside film 226B may be formed over the third backside film 224B together with the formation of mask layer 226A. In some embodiments, the mask layer 226A may be formed by CVD, HDP CVD, sputtering, PVD, or a combination thereof, without forming a backside film over the backside 202B of the substrate 202. In some embodiments, the fourth backside film 226B may be conformally deposited and thus may have top surfaces conformal to profiles of underlying features, such as the third backside film 224B and the contaminants 209, respectively.

Figure 15:
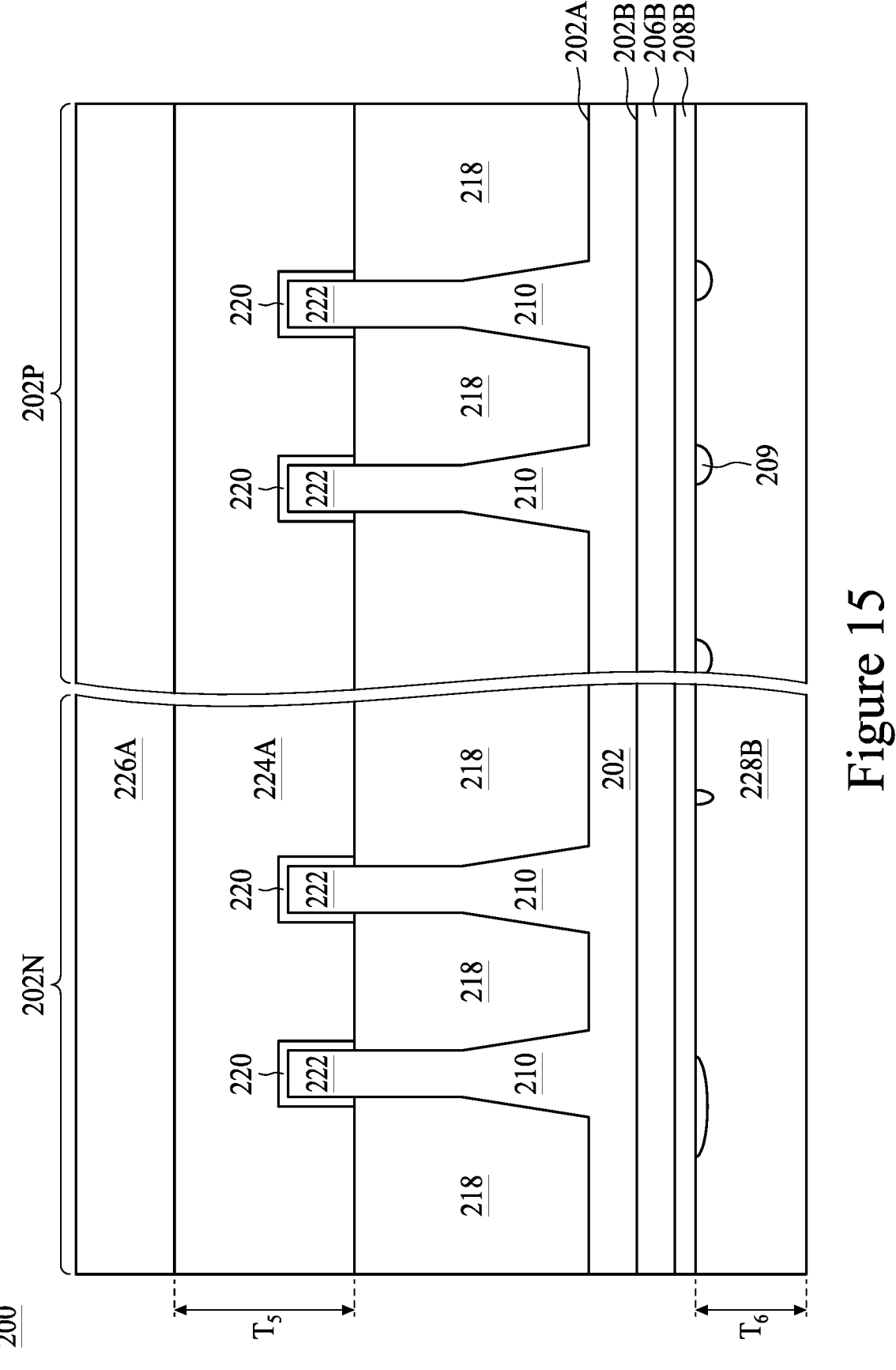

In FIG. 15, a backside planarization process, such as a backside CMP, is applied to the third backside film 224B, thereby forming a third backside film 228B having a planar surface, in accordance with some embodiments. In some embodiments, a portion of the third backside film 224B is removed by the backside CMP so that the humps or protrusions 225 on the top surface of the third backside film 224B are removed, and a substantially planar and clean top surface of the third backside film 228B is created. For example, about 10% to about 95% of the total thickness $T_4$ of the third backside film 224B may be removed by the backside CMP. In some embodiments, a thickness removed from the third backside film 224B by the backside CMP may be greater than a thickness removed from the dummy gate material by the frontside CMP. As discussed in great detail below, the dummy gate layer 224A may have thickness requirements for being replaced with active features of the FinFETs 200 in later stages (e.g., the thickness $T_5$ of the dummy gate layer 224A may affect the gate height of the FinFETs 200), while backside films have no such concerns, and a greater extent of the thickness of the third backside film 224B may be removed to make sure that the third backside film 228B has sufficient surface flatness and cleanness in the later EUV lithography process. In some embodiments, the third backside film 228B has a thickness $T_6$ of about 100 angstroms to about 900 angstroms. In some embodiments, the thickness $T_6$ may be about 500 angstroms or any value being adjusted by the feedback of an advanced process control system. The third backside film 228B may have a surface roughness (Ra) of about 5 angstroms to about 100 angstroms, or less than about 20 angstroms.

In some embodiments where the fourth backside film 226B is formed, the fourth backside film 226B is removed by a backside etch process (e.g., a wet etch or a dry etch without etching films over the frontside 202A of the substrate 202) prior to the backside CMP or is directly removed by the backside CMP. In some embodiments, the removal of the fourth backside film 226B may prevent the risk that a EUV chuck from being damaged in the later EUV lithography process because of the hardness of the fourth backside film 226B.

FIGS. 16A through 24B illustrate various additional steps in the manufacturing of embodiment devices. FIGS. 16A through 24B illustrate features in either of the region 202N and the region 202P. For example, the structures illustrated in FIGS. 16A through 24B may be applicable to both the region 202N and the region 202P. Differences (if any) in the structures of the region 202N and the region 202P are described in the text accompanying each figure.

Figure 16B:
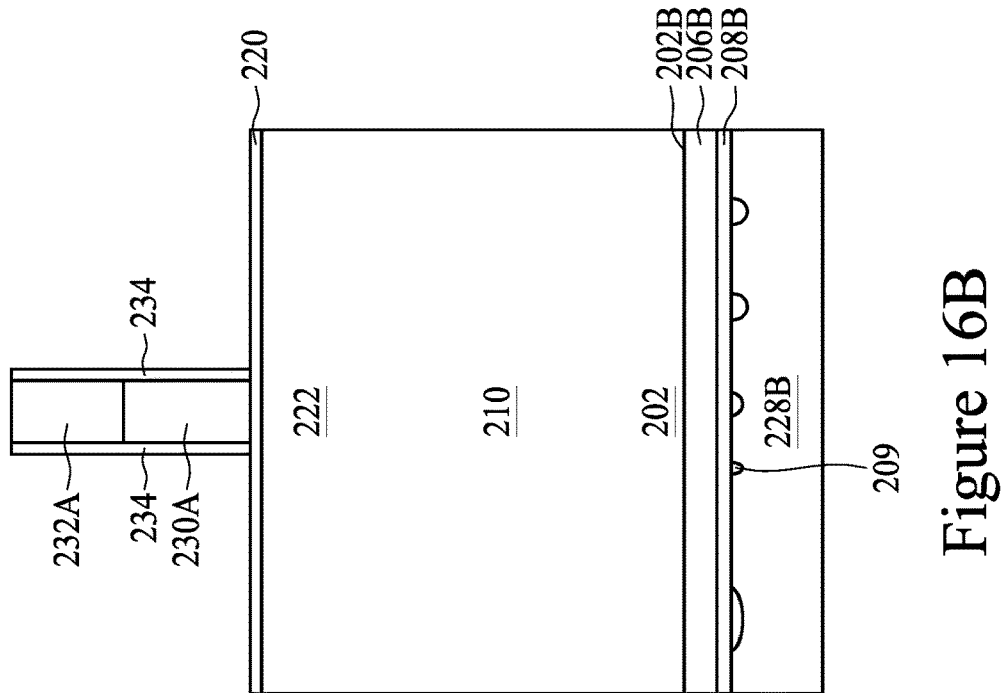
Figure 16A:
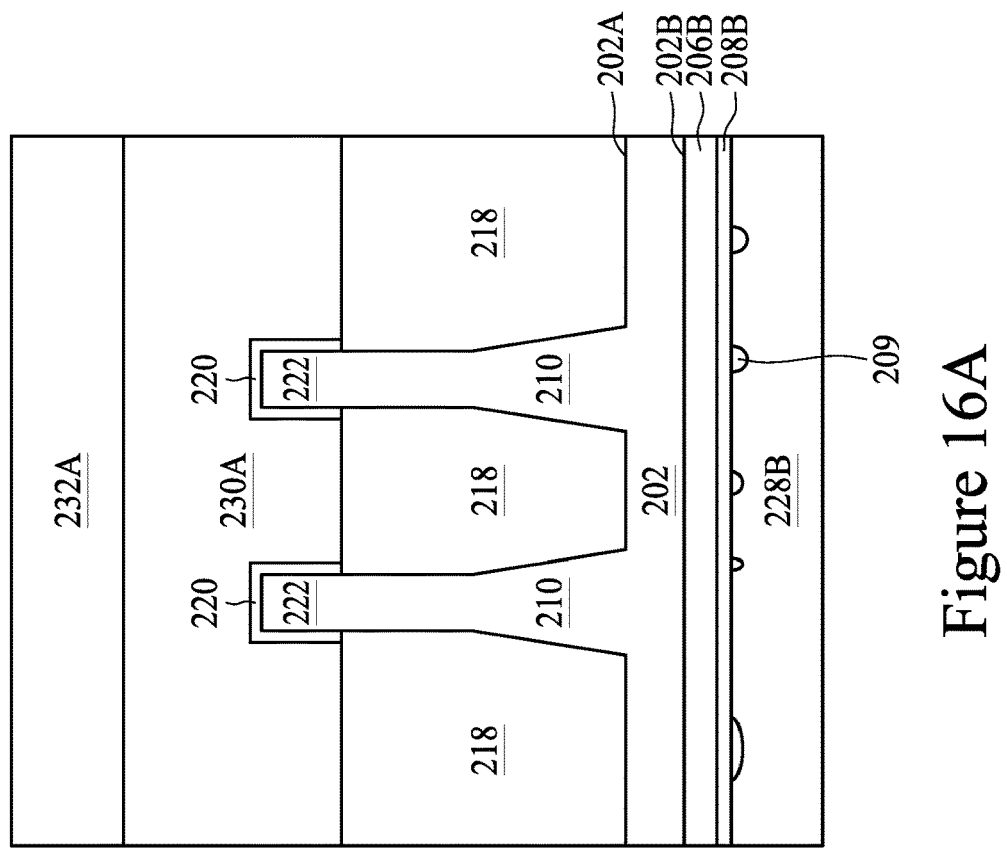

In FIGS. 16A and 16B, the dummy gate layer 224A and the mask layer 226A are patterned using acceptable lithography and etching techniques to form dummy gates 230A and masks 232A, respectively, in accordance with some embodiments, the lithography process may include a EUV lithography process that uses extreme violet radiation having a wavelength of about 11 nm to about 14 nm, or about 13.5 nm. In some embodiments, the EUV lithography process may include applying a photoresist layer (not shown) over the mask layer 226A and irradiating the photoresist layer by the extreme ultraviolet radiation to define a pattern of a photomask in the photoresist layer. In some embodiments, the EUV lithography process may be repeated for being applied to a double-patterning process or multiple-patterning processes. In the EUV lithography process, the EUV chuck 120, as illustrated in FIG. 5, may be disposed over the backside 202B of the substrate 202. The EUV chuck 120 may contact the top surface of the third backside film 228B to jack up the substrate 202 to perform the EUV lithography process. In some embodiments, substrate deformation and/or unexpected topography variances of the photoresist layer, which may be caused by the EUV chuck 120 jacking up the humps or protrusions 225 on the top surface of the third backside film 228B, may be reduced or prevented because the top surface of the third backside film 228B is planarized and cleaned by the backside CMP process applied to the third backside film 224B. As such, the EUV lithography process may have reduced overlay errors and improved yield. Also, a lifetime of the EUV chuck 120 may be extended because the risks that the pins 124 of the EUV chuck 120 suffer extra stress and thus being damaged or broken by contacting or jacking up the humps or protrusions 225 on the third backside film 228B may be reduced or eliminated.

In some embodiments, a pattern of the photoresist layer patterned by the EUV lithography process is transferred to the mask layer 226A and the dummy gate layer 224A by acceptable etching techniques to physically separate each of the dummy gates 230A from adjacent dummy gates. The dummy gates 230A cover respective channel regions 222 of the fins 210. The dummy gates 230A may also have a lengthwise direction substantially perpendicular to the lengthwise direction of respective epitaxial fins 210.

Further, in FIGS. 16A and 16B, gate seal spacers 234 can be formed over exposed surfaces of the dummy gates 230A, the masks 232A, and/or the fins 210. Thermal oxidation or a deposition followed by an anisotropic etch may form the gate seal spacers 234. After the formation of the gate seal spacers 234, implants for lightly doped source/drain (LDD) regions (not explicitly illustrated) may be performed. In the embodiments with different device types, similar to the implants discussed above in FIG. 12, a mask, such as a photoresist, may be formed over the region 202N, while exposing the region 202P, and appropriate type (e.g., p-type) impurities may be implanted into the exposed fins 210 in the region 202P. The mask may then be removed. Subsequently, a mask, such as a photoresist, may be formed over the region 202P while exposing the region 202N, and appropriate type impurities (e.g., n-type) may be implanted into the exposed fins 210 in the region 202N. The mask may then be removed. The n-type impurities may be the any of the n-type impurities previously discussed, and the p-type impurities may be the any of the p-type impurities previously discussed. The lightly doped source/drain regions (e.g., a lightly doped source region or a lightly doped drain region) may have a concentration of impurities of from about $10^{15}$ cm$^{-3}$ to about $10^{16}$ cm$^{-3}$. An anneal may be used to activate the implanted impurities.

Figure 17B:
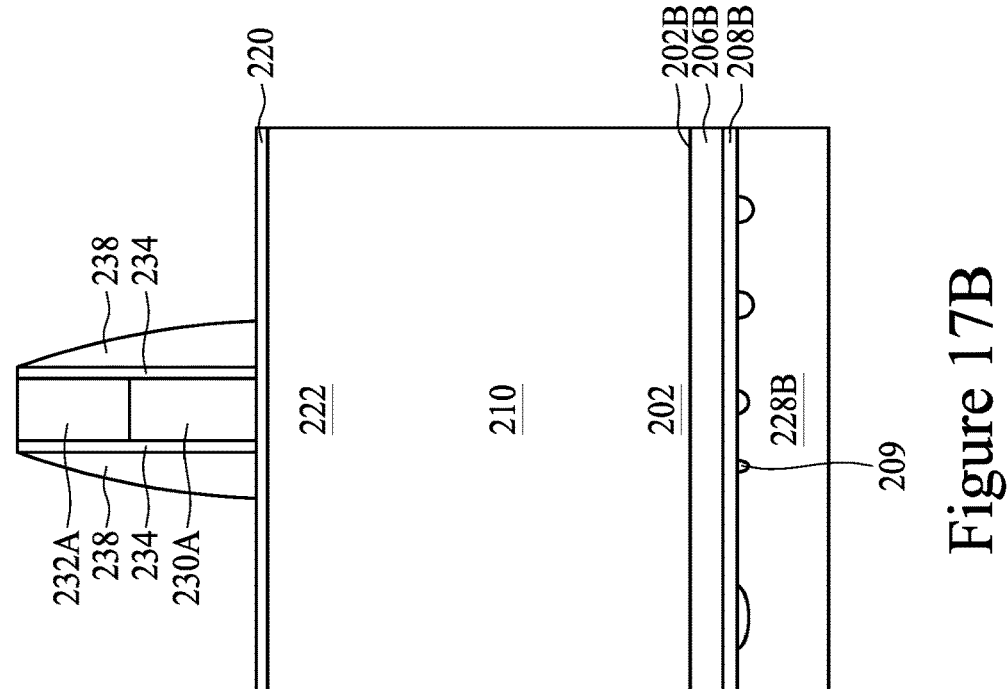
Figure 17A:
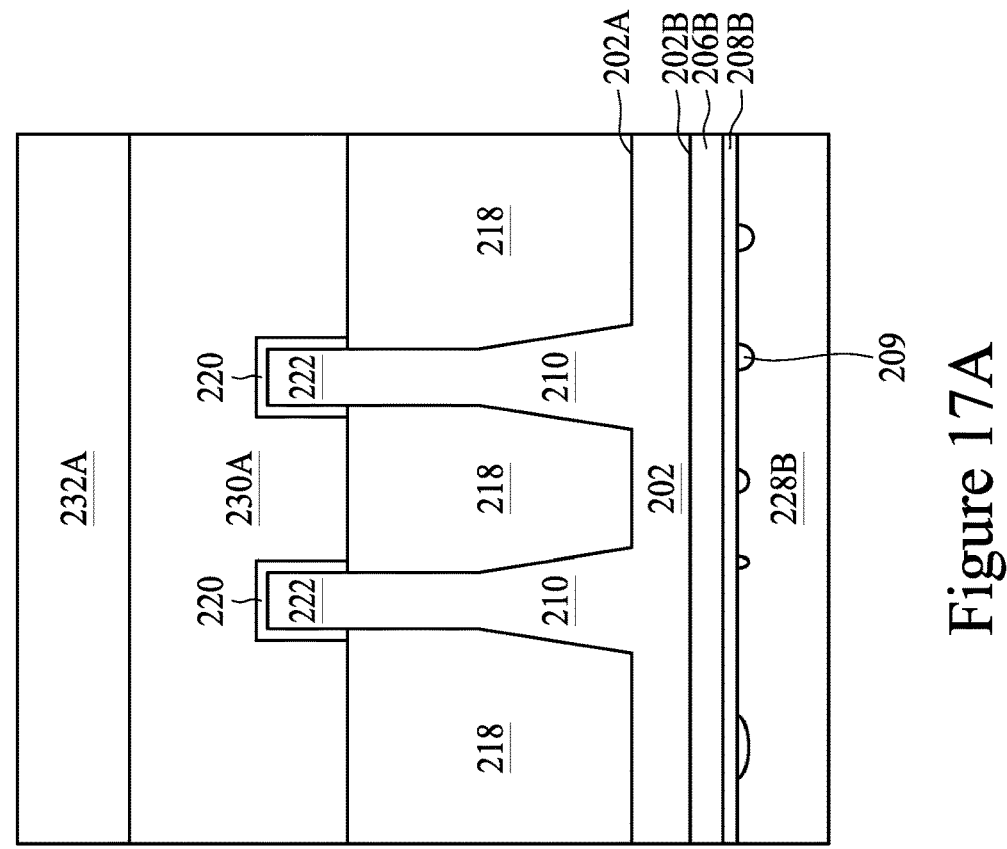

In FIGS. 17A and 17B, gate spacers 238 are formed over the gate seal spacers 234 along sidewalls of the dummy gates 230A and the masks 232A. The gate spacers 238 may be formed by conformally depositing an insulating material and subsequently anisotropically etching the insulating material. The insulating material of the gate spacers 238 may be silicon nitride, SiCN, a combination thereof, or the like.

Figure 18B:
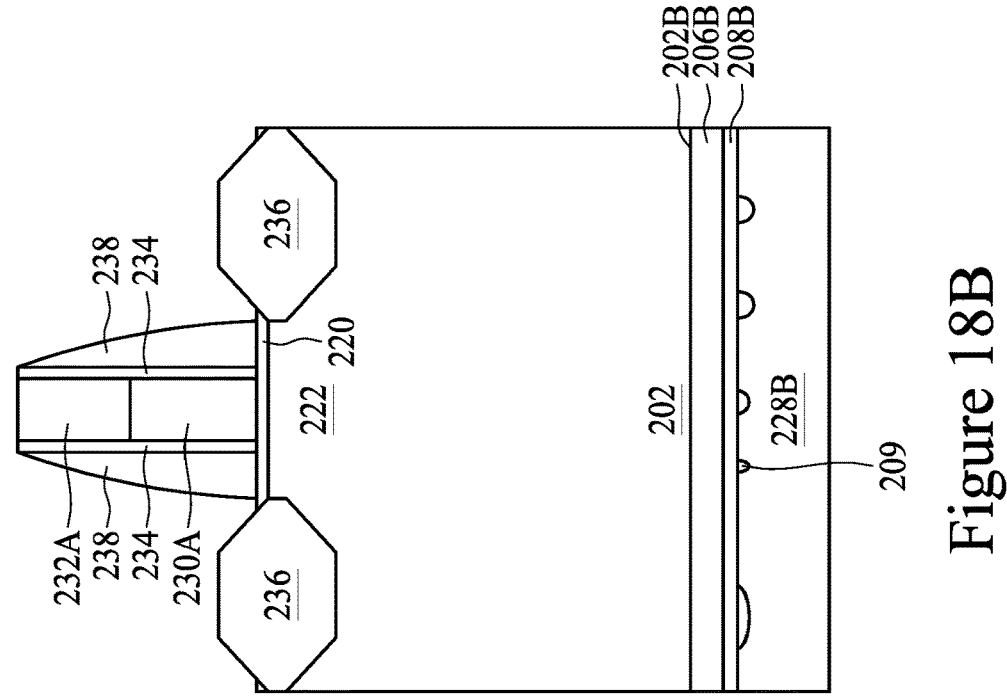
Figure 18A:
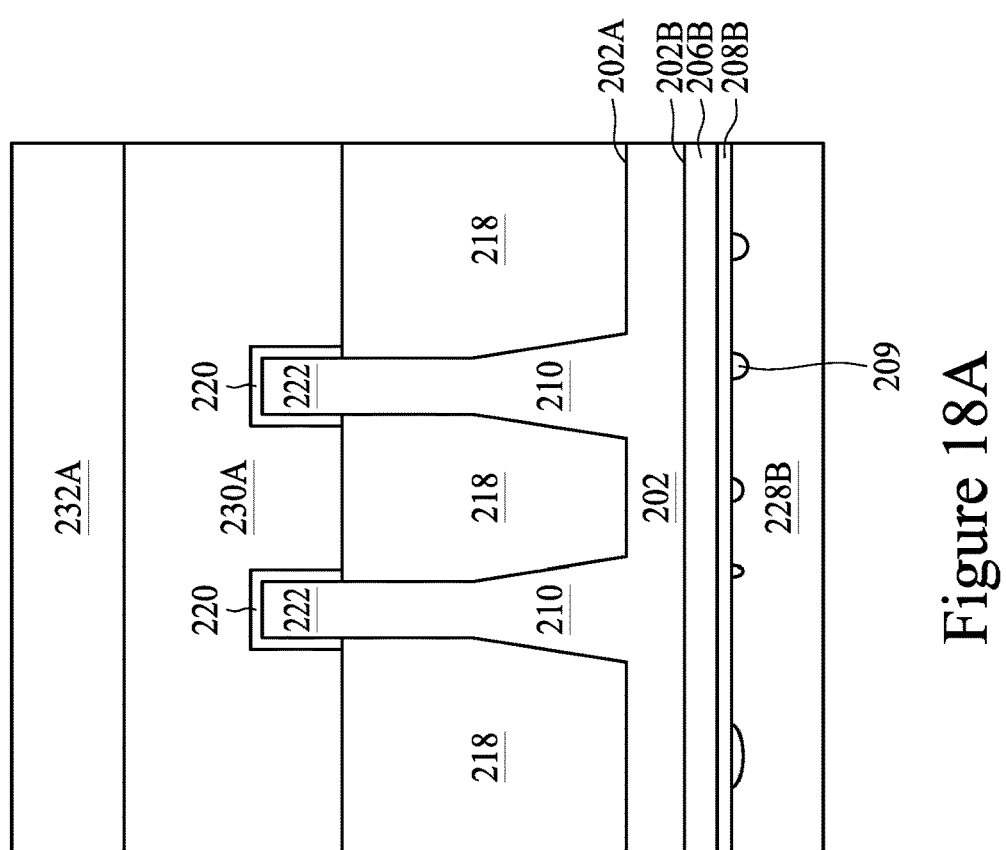
Figures 18C, 18D:
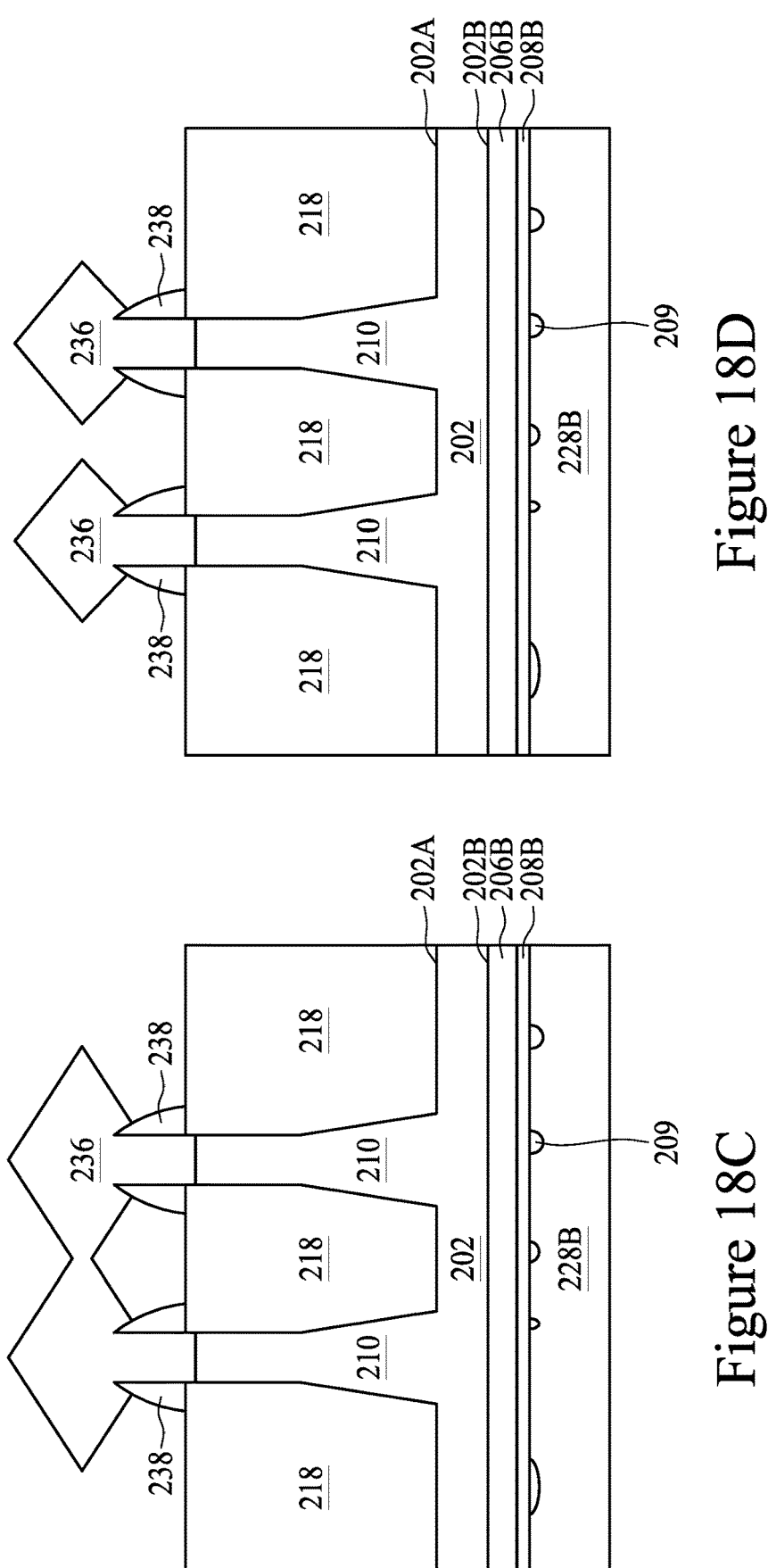

In FIGS. 18A and 18B epitaxial source/drain regions 236 are formed in the fins 210 to exert stress in the respective channel regions 222, thereby improving performance. The epitaxial source/drain regions 236 are formed in the fins 210 such that each dummy gate 230A is disposed between respective neighboring pairs of the epitaxial source/drain regions 236. In some embodiments, the epitaxial source/drain regions 236 may extend into, and may also penetrate through, the fins 210. In some embodiments, the gate spacers 238 are used to separate the epitaxial source/drain regions 236 from the dummy gates 230A by an appropriate lateral distance so that the epitaxial source/drain regions 236 do not short out subsequently formed gates of the resulting Fin-FETs.

The epitaxial source/drain regions 236 in the region 202N, e.g., the NMOS region, may be formed by masking the region 202P, e.g., the PMOS region, and etching source/drain regions of the fins 210 in the region 202N to form recesses in the fins 210. Then, the epitaxial source/drain regions 236 in the region 202N are epitaxially grown in the recesses. The epitaxial source/drain regions 236 may include any acceptable material, such as appropriate for n-type FinFETs. For example, if the fin 210 is silicon, the epitaxial source/drain regions 236 in the region 202N may include materials exerting a tensile strain in the channel region 222, such as silicon, SiC, SiCP, SiP, or the like. The epitaxial source/drain regions 236 in the region 202N may have surfaces raised from respective surfaces of the fins 210 and may have facets.

The epitaxial source/drain regions 236 in the region 202P, e.g., the PMOS region, may be formed by masking the region 202N, e.g., the NMOS region, and etching source/drain regions of the fins 210 in the region 202P are etched to form recesses in the fins 210. Then, the epitaxial source/drain regions 236 in the region 202P are epitaxially grown in the recesses. The epitaxial source/drain regions 236 may include any acceptable material, such as appropriate for p-type FinFETs. For example, if the fin 210 is silicon, the epitaxial source/drain regions 236 in the region 202P may comprise materials exerting a compressive strain in the channel region 222, such as SiGe, SiGeB, Ge, GeSn, or the like. The epitaxial source/drain regions 236 in the region 202P may also have surfaces raised from respective surfaces of the fins 210 and may have facets.

The epitaxial source/drain regions 236 and/or the fins 210 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 236 may be in situ doped during growth.

As a result of the epitaxy processes used to form the epitaxial source/drain regions 236 in the region 202N and the region 202P, upper surfaces of the epitaxial source/drain regions have facets which expand laterally outward beyond sidewalls of the fins 210. In some embodiments, these facets cause adjacent source/drain regions 236 of a same FinFET to merge, as illustrated by FIG. 18C. In other embodiments, adjacent source/drain regions 236 remain separated after the epitaxy process is completed as illustrated by FIG. 18D.

Figure 19B:
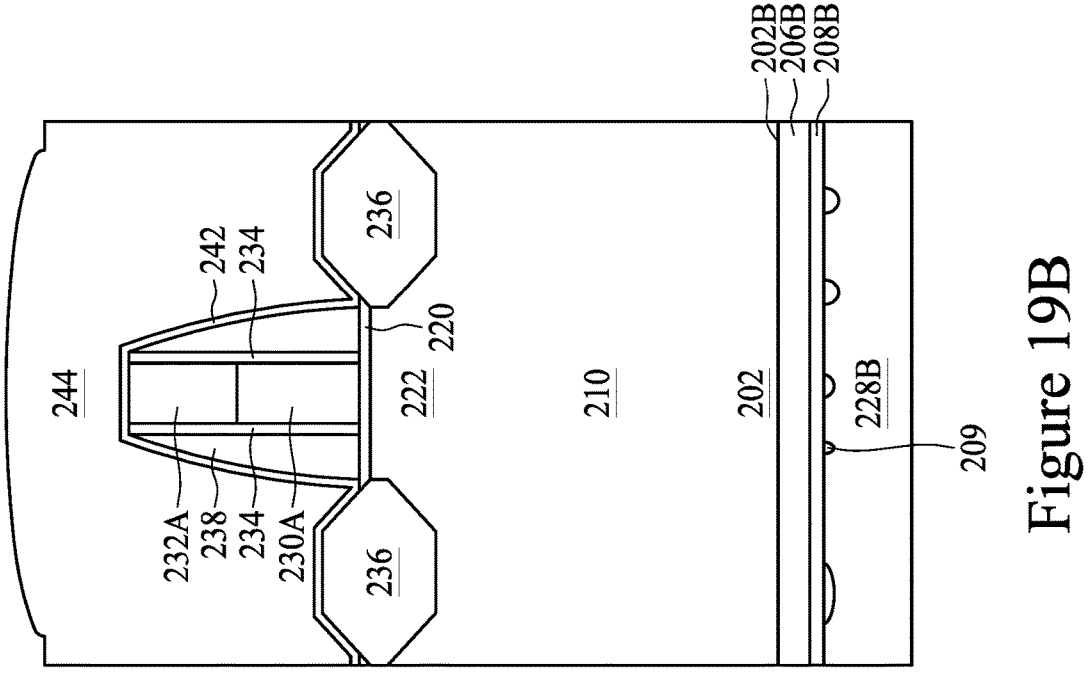
Figure 19A:
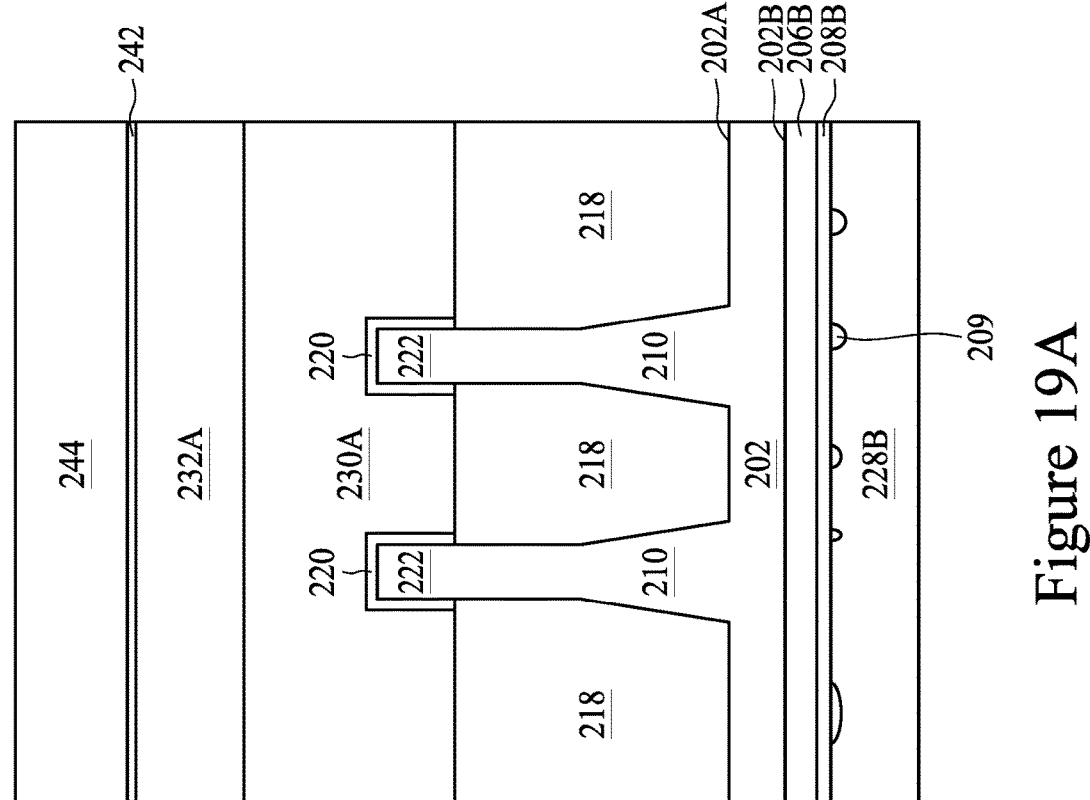

In FIGS. 19A and 19B, a first ILD 244 is deposited over the structure illustrated in FIGS. 18A and 18B. The first ILD 244 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 242 is disposed between the first ILD 244 and the epitaxial source/drain regions 236, the masks 232A, and the gate spacers 238. The CESL 242 may comprise a dielectric material, such as, silicon nitride, silicon oxide, silicon oxynitride, or the like, having a different etch rate than the material of the overlying first ILD 244.

Figure 20B:
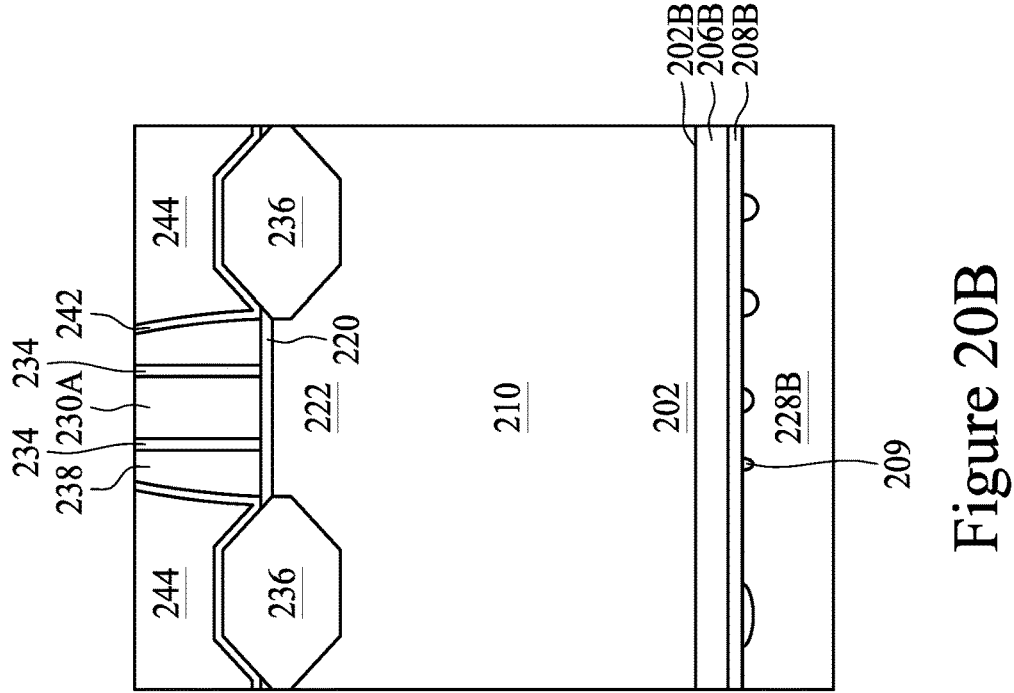
Figure 20A:
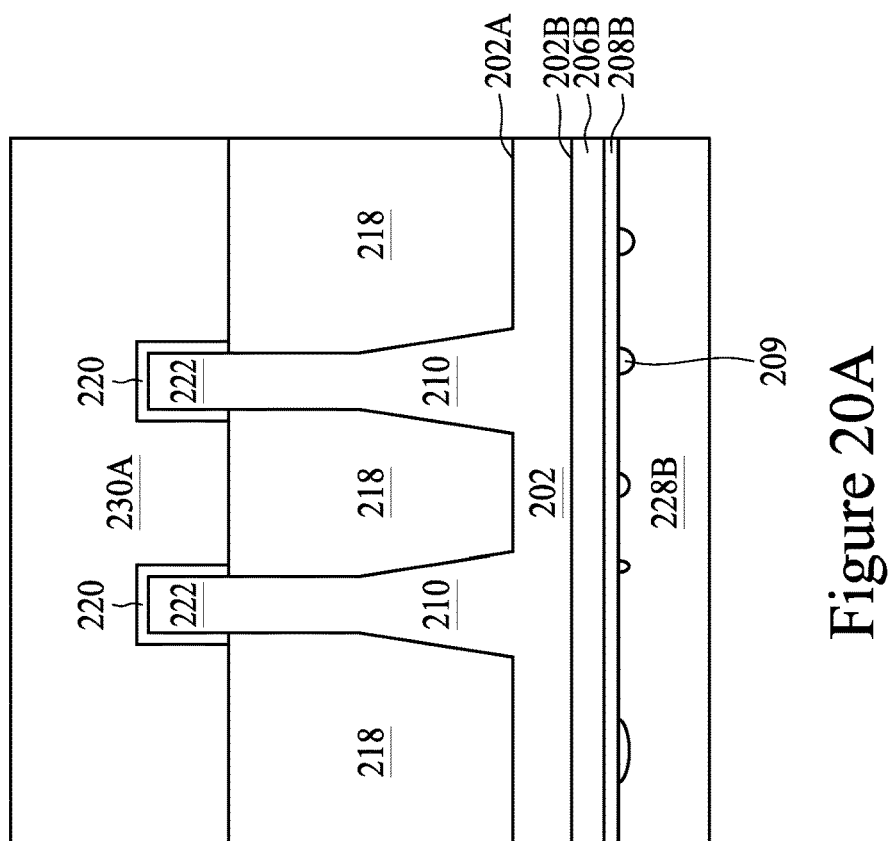

In FIGS. 20A and 20B, a planarization process, such as a CMP, may be performed to level the top surface of the first ILD 244 with the top surfaces of the dummy gates 230A or the masks 232A. The planarization process may also remove the masks 232A over the dummy gates 230A, and portions of the gate seal spacers 234 and the gate spacers 238 along sidewalls of the masks 232A. After the planarization process, top surfaces of the dummy gates 230A, the gate seal spacers 234, the gate spacers 238, and the first ILD 244 are level. Accordingly, the top surfaces of the dummy gates 230A are exposed through the first ILD 244. In some embodiments, the masks 232A may remain, in which case the planarization process levels the top surface of the first ILD 244 with the top surfaces of the top surface of the masks 232A.

Figure 21B:
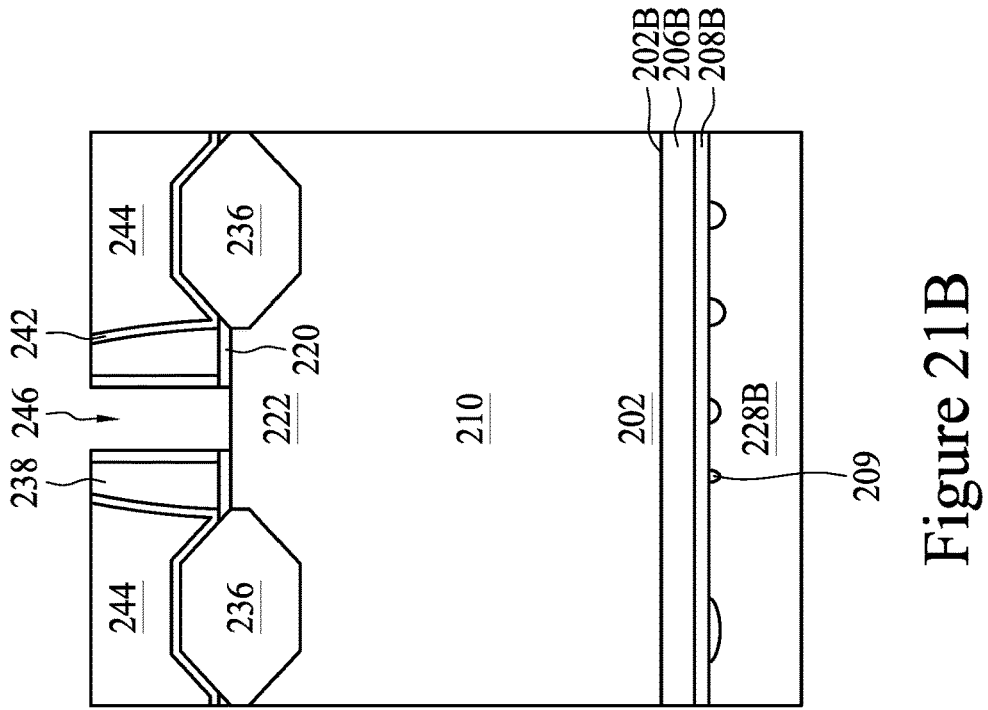
Figure 21A:
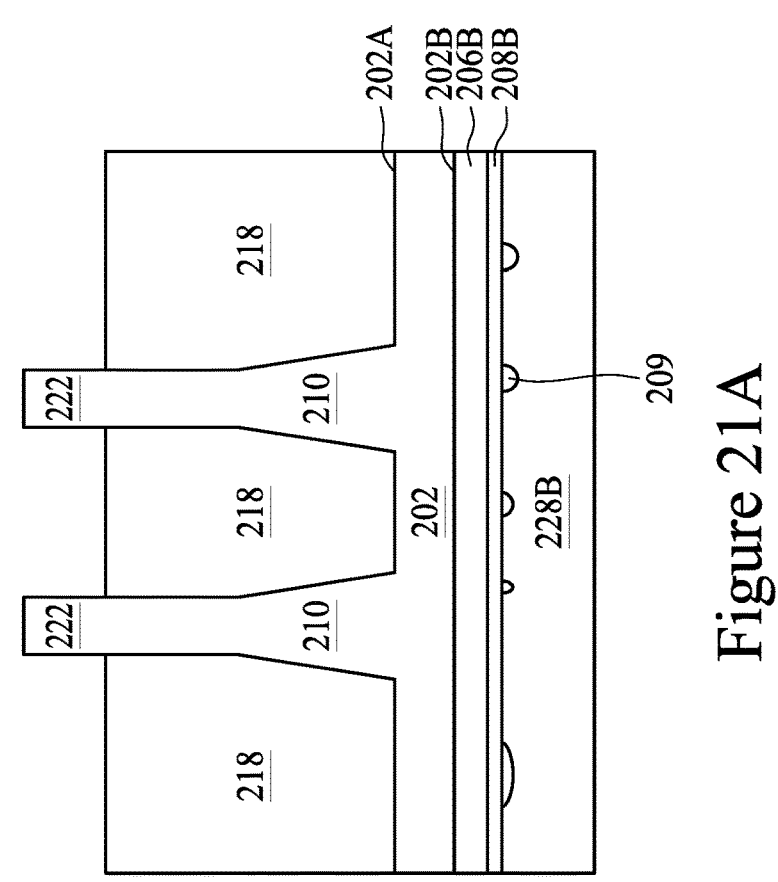

In FIGS. 21A and 21B, the dummy gates 230A, and the masks 232A if present, are removed in an etching step(s), so that recesses 246 are formed. Portions of the dummy dielectric layer 220 in the recesses 246 may also be removed. In some embodiments, only the dummy gates 230A are removed, and the dummy dielectric layer 220 remains and is exposed by the recesses 246. In some embodiments, the dummy dielectric layer 220 is removed from recesses 246 in a first region of a die (e.g., a core logic region) and remains in recesses 246 in a second region of the die (e.g., an input/output region). In some embodiments, the dummy gates 230A are removed by an anisotropic dry etch process. For example, the etching process may include a dry etch process using reaction gas(es) that selectively etch the dummy gates 230A without etching the first ILD 244 or the gate spacers 238. Each recess 246 exposes a channel region 222 of a respective fin 210. Each channel region 222 is disposed between neighboring pairs of the epitaxial source/drain regions 236. During the removal, the dummy dielectric layer 220 may be used as an etch stop layer when the dummy gates 230A are etched. The dummy dielectric layer 220 may then be optionally removed after the removal of the dummy gates 230A.

Figure 22B:
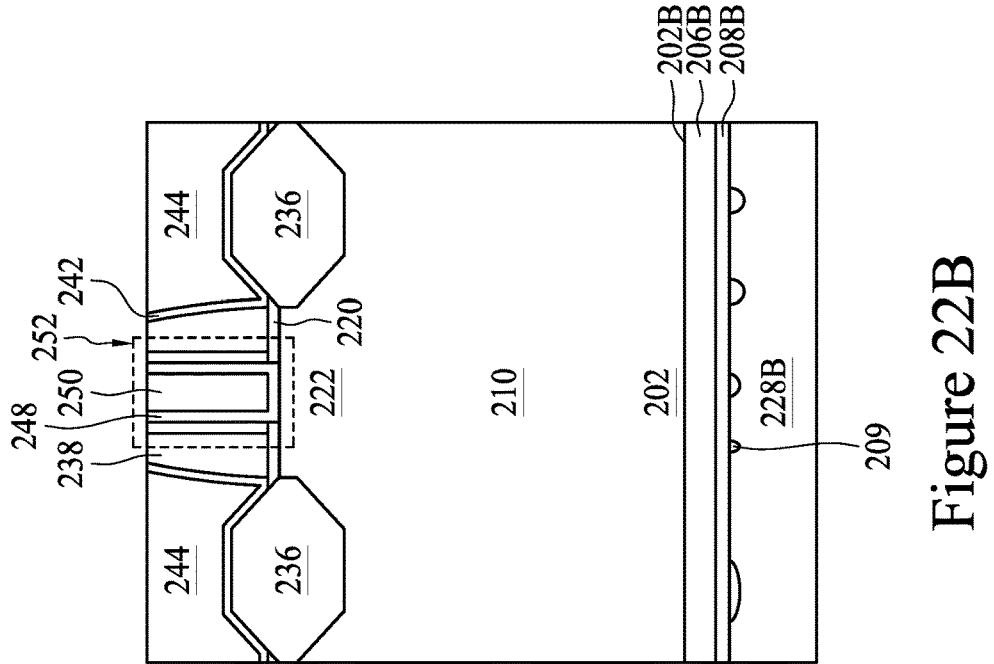
Figure 22A:
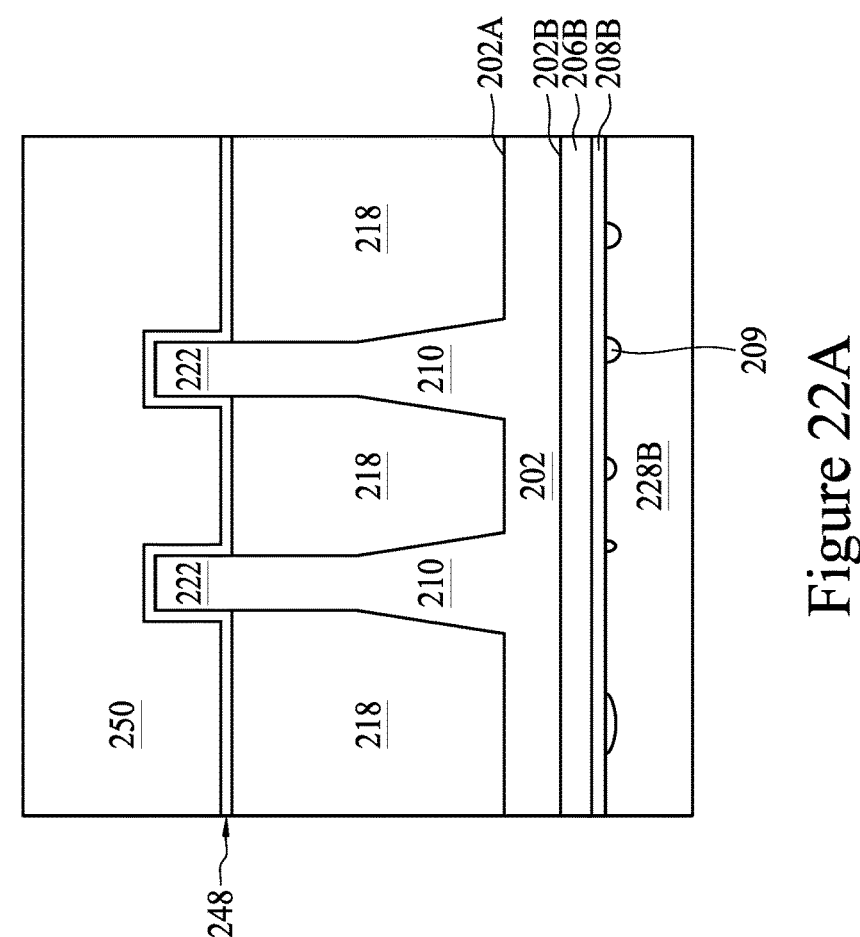
Figure 22C:
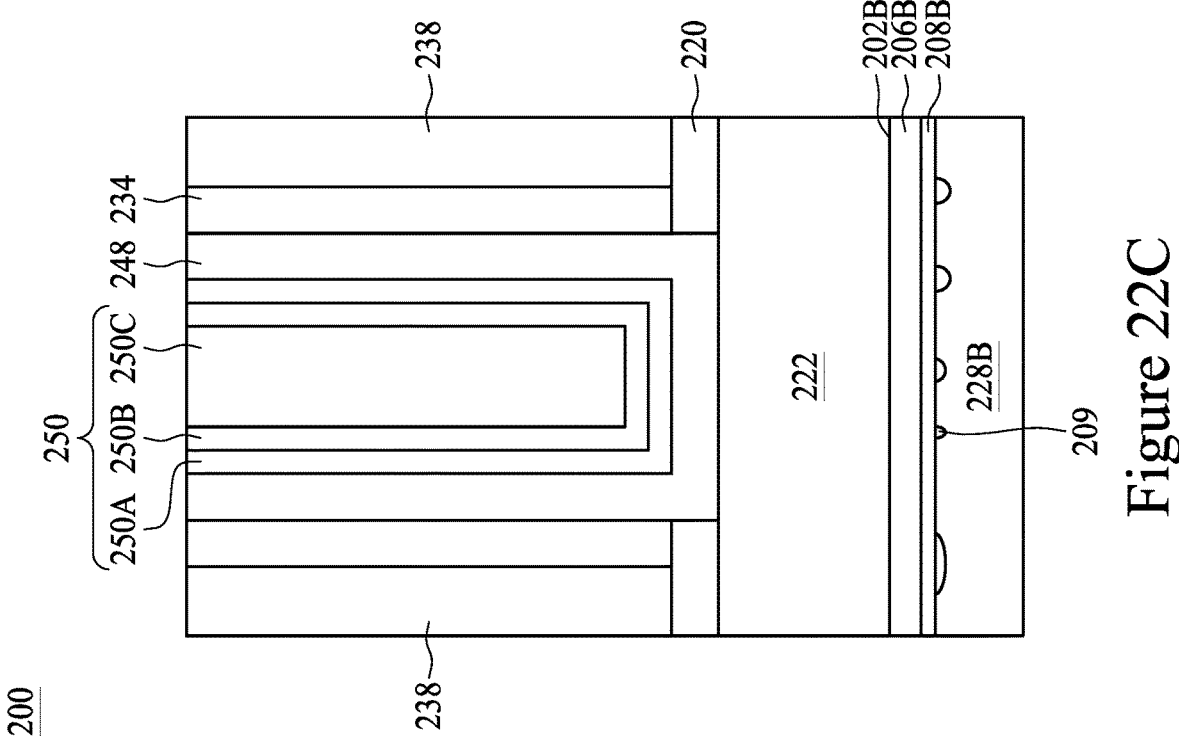

In FIGS. 22A and 22B, gate dielectric layers 248 and gate electrodes 250 are formed for replacement gates. FIG. 22C illustrates a detailed view of region 252 of FIG. 22B. Gate dielectric layers 248 are deposited conformally in the recesses 246, such as over the top surfaces and the sidewalls of the fins 210 and over sidewalls of the gate seal spacers 234/gate spacers 238. The gate dielectric layers 248 may also be formed over top surface of the first ILD 244. In accordance with some embodiments, the gate dielectric layers 248 comprise silicon oxide, silicon nitride, or multilayers thereof. In some embodiments, the gate dielectric layers 248 include a high-k dielectric material, and in these embodiments, the gate dielectric layers 248 may have a k value greater than about 7.0, and may include a metal oxide or a silicate of Hf, Al, Zr, La, Mg, Ba, Ti, Pb, and combinations thereof. The formation methods of the gate dielectric layers 248 may include Molecular-Beam Deposition (MBD), ALD, PECVD, and the like. In embodiments where portions of the dummy dielectric layer 220 remain in the recesses 246, the gate dielectric layers 248 include a material of the dummy dielectric layer 220 (e.g., $SiO_2$).

The gate electrodes 250 are deposited over the gate dielectric layers 248, respectively, and fill the remaining portions of the recesses 246. The gate electrodes 250 may include a metal-containing material such as TiN, TiO, TaN, TaC, Co, Ru, Al, W, combinations thereof, or multilayers thereof. For example, although a single layer gate electrode 250 is illustrated in FIG. 22B, the gate electrode 250 may comprise any number of liner layers 250A, any number of work function tuning layers 250B, and a fill material 250C as illustrated in FIG. 22C. After the filling of the gate electrodes 250, a planarization process, such as a CMP process, may be performed to remove the excess portions of the gate dielectric layers 248 and the material of the gate electrodes 250, which excess portions are over the top surface of the first ILD 244. The remaining portions of material of the gate electrodes 250 and the gate dielectric layers 248 thus form replacement gates of the resulting FinFETs 200. The gate electrodes 250 and the gate dielectric layers 248 may be collectively referred to as a "gate stack." The gate and the gate stacks may extend along sidewalls of a channel region 222 of the fins 210. In some embodiments, the gate electrodes 250 have a thickness substantially the same as the thickness $T_5$ of the dummy gates 230A.

The formation of the gate dielectric layers 248 in the region 202N and the region 202P may occur simultaneously such that the gate dielectric layers 248 in each region are formed from the same materials, and the formation of the gate electrodes 250 may occur simultaneously such that the gate electrodes 250 in each region are formed from the same materials. In some embodiments, the gate dielectric layers 248 in each region may be formed by distinct processes, such that the gate dielectric layers 248 may be different materials, and/or the gate electrodes 250 in each region may be formed by distinct processes, such that the gate electrodes 250 may be different materials. Various masking steps may be used to mask and expose appropriate regions when using distinct processes.

Figure 23B:
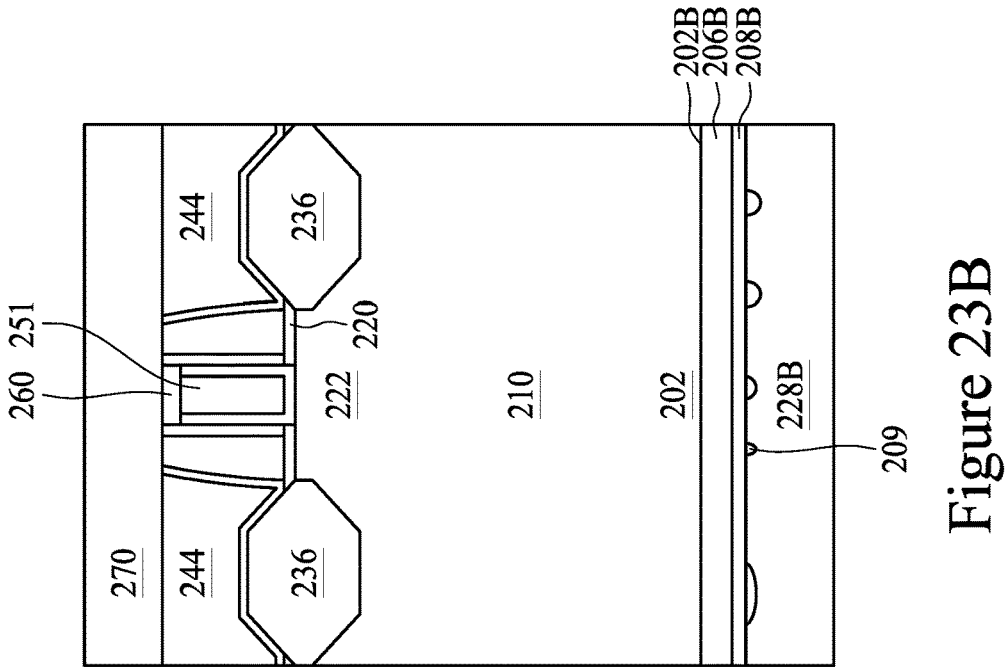
Figure 23A:
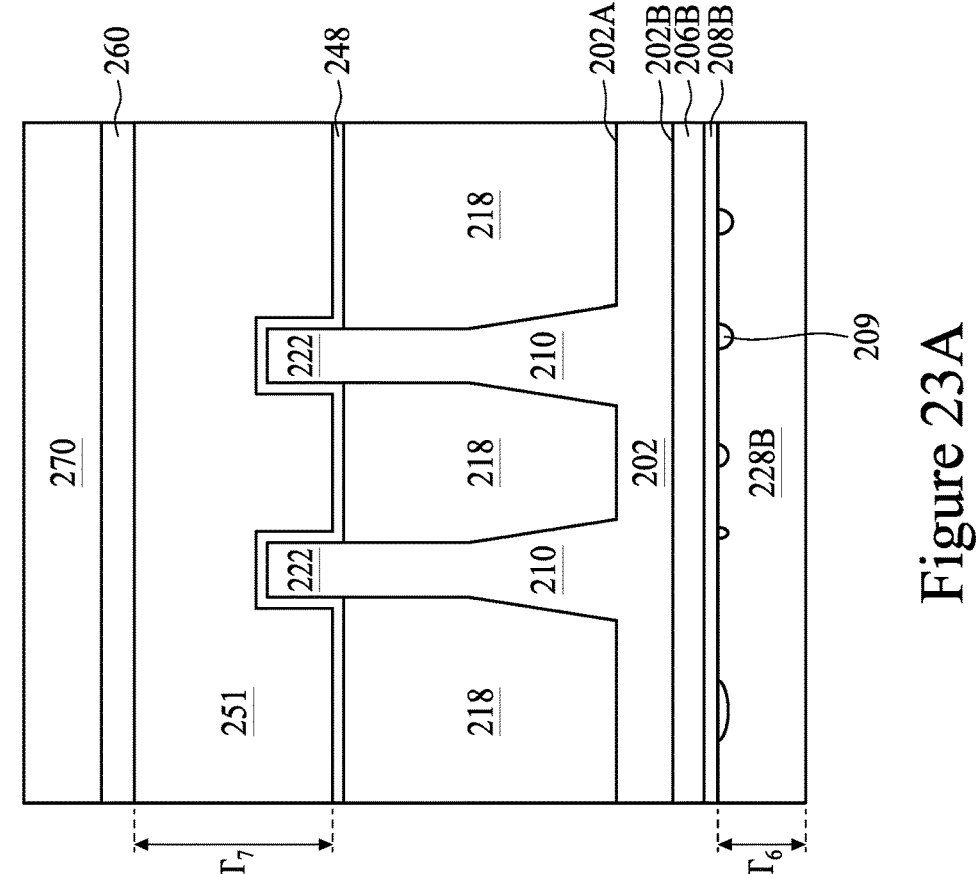

In FIGS. 23A and 23B, a second ILD 270 is deposited over the first ILD 244. In some embodiment, the second ILD 270 is a flowable film formed by a flowable CVD method. In some embodiments, the second ILD 270 is formed of a dielectric material such as PSG, BSG, BPSG, USG, or the like, and may be deposited by any suitable method, such as CVD and PECVD. In accordance with some embodiments, before the formation of the second ILD 270, the gate stack (including a gate dielectric layer 248 and a corresponding overlying gate electrode 250) is recessed so that a recess is formed directly over the recessed gate electrode 251 and the gate dielectric layer 248 and between opposing portions of gate spacers 238, as illustrated in FIGS. 23A and 23B. A gate mask 260 comprising one or more layers of dielectric material, such as silicon nitride, silicon oxynitride, or the like, is filled in the recess, followed by a planarization process to remove excess portions of the dielectric material extending over the first ILD 244. The subsequently formed gate contacts 272 (FIGS. 22A and 22B) penetrate through the gate mask 260 to contact the top surface of the recessed gate electrode 251. In some embodiments, only a small portion of the gate electrodes 250 is removed because of the thickness requirements of features (e.g., gate height of the FinFETs) of the FinFETs 200 and to prevent further damaging the gate stack. In some embodiments, the recessed gate electrodes 251 have a thickness $T_7$ of about 500 angstroms to about 1000 angstroms, which may be still greater than the thickness $T_6$ of the third backside film 228B.

Figure 24B:
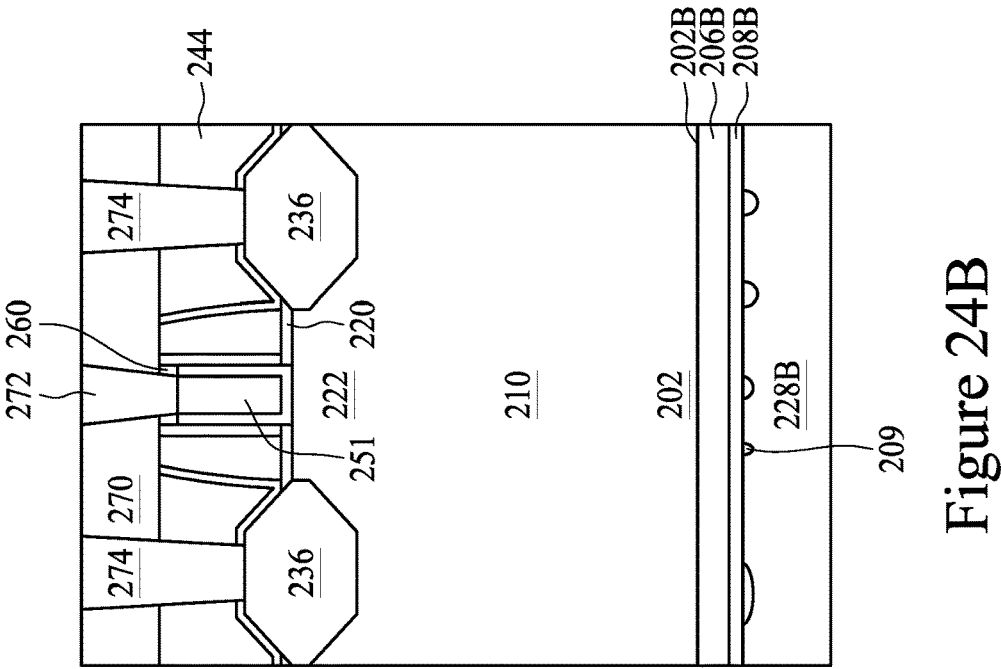
Figure 24A:
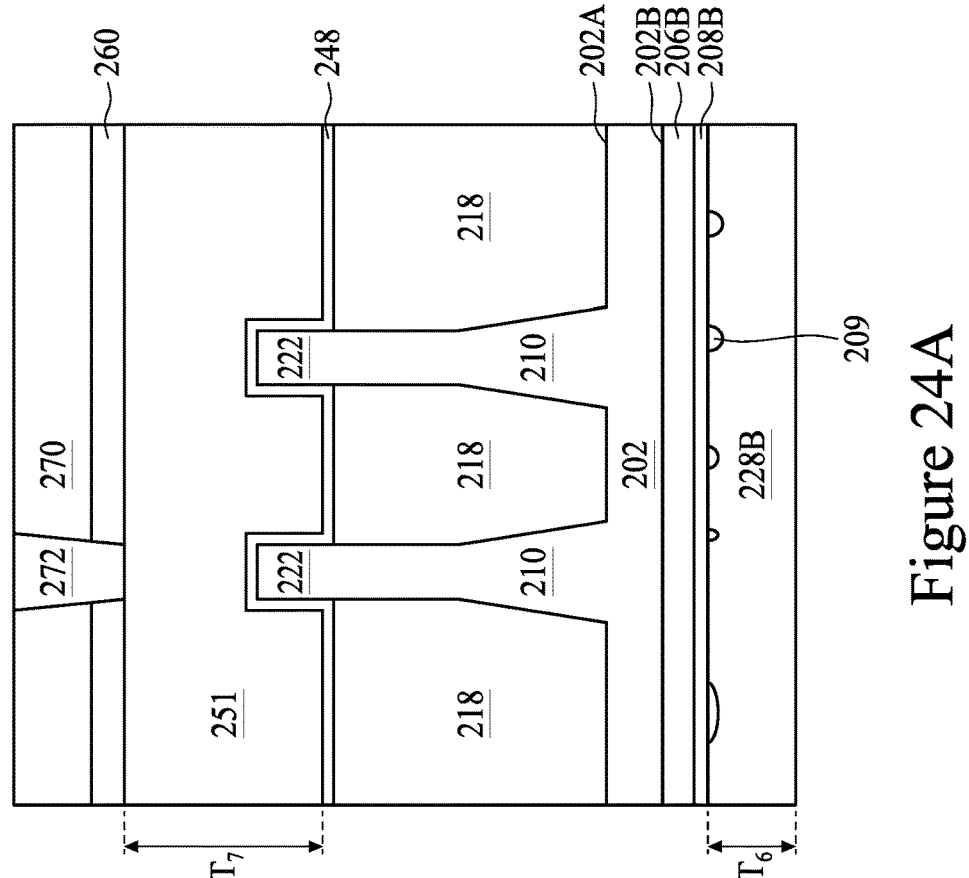

In FIGS. 24A and 24B, gate contacts 272 and source/drain contacts 274 are formed through the second ILD 270 and the first ILD 244 in accordance with some embodiments. Openings for the source/drain contacts 274 are formed through the first and second ILDs 244 and 270, and openings for the gate contact 272 are formed through the second ILD 270 and the gate mask 260. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 270. The remaining liner and conductive material form the source/drain contacts 274 and gate contacts 272 in the openings. An anneal process may be performed to form a silicide at the interface between the epitaxial source/drain regions 236 and the source/drain contacts 274. The source/drain contacts 274 are physically and electrically coupled to the epitaxial source/drain regions 236, and the gate contacts 272 are physically and electrically coupled to the gate electrodes 251. The source/drain contacts 274 and gate contacts 272 may be formed in different processes, or may be formed in the same process. Although shown as being formed in the same cross-sections, it should be appreciated that each of the source/drain contacts 274 and gate contacts 272 may be formed in different cross-sections, which may avoid shorting of the contacts.

According to various embodiments of the present disclosure, methods of manufacturing a semiconductor device with the use of EUV lithography techniques are provided. In some embodiments, before performing the EUV lithography to films over a frontside of the substrate, a backside film may be formed over the backside of the substrate. A backside CMP process may be applied to the backside film, creating a substantially planar and clean top surface of the backside film. EUV lithography overlay errors resulting from substrate deformation and/or unexpected topography variances of the frontside film or a film over it may be reduced or prevented. Also, the EUV chuck may have extended lifetime by avoiding to suffer extra stress by contacting the humps or protrusions on the top surface of the backside film.

In an embodiment, a method of forming a semiconductor device is provided. The method includes forming a first film over an active region of a first side of a semiconductor substrate and a second film over a second side of the semiconductor substrate opposing to the first side of the semiconductor substrate; applying a chemical mechanical polishing to remove at least a portion of the second film; after the chemical mechanical polishing, forming a photoresist layer over the first film; and patterning the photoresist layer using an extreme ultraviolet radiation. In an embodiment, the first film and the second film are formed in a same process. In an embodiment, the first film and the second film are formed by a thermal growth process or atomic layer deposition. In an embodiment, the first film is a dummy gate layer. In an embodiment, the method further includes etching the first film after patterning the photoresist layer. In an embodiment, the first film and the second film include polycrystalline silicon, polycrystalline silicon germanium, silicon nitride, silicon oxide, silicon oxynitride, silicon oxygen carbon nitride, silicon carbon nitride, or a combination thereof. In an embodiment, the method further includes before forming the first film and the second film, forming a third film over the active region over the first side of the semiconductor substrate and a fourth film over the second side of the semiconductor substrate, wherein the third film and the fourth film are formed in a same process. In an embodiment, the method further includes forming a fifth film over the first film and a sixth film over the second film before forming the photoresist layer, wherein the fifth film and the sixth film are formed of a same material; and removing the sixth film before applying the chemical mechanical polishing. In an embodiment, the sixth film is removed by an etching process.

In an embodiment, a method of forming a semiconductor device is provided. The method includes forming a plurality of fins over a first side of a semiconductor substrate; forming a first film over the fins and a second film over a second side of the semiconductor substrate opposing to the first side of the semiconductor substrate; applying a first chemical mechanical polishing to remove a first thickness from the second film; and patterning the first film. In an embodiment, the method further includes applying a second chemical mechanical polishing to remove a second thickness from the first film before patterning the first film. In an embodiment, the first thickness is greater than the second thickness. In an embodiment, the method further includes forming a third film over the first film and patterning the third film using an extreme ultraviolet radiation after applying the first chemical mechanical polishing. In an embodiment, the method further includes forming a fourth film over the first film and a fifth film over the second film; and removing the fifth film before patterning the first film. In an embodiment, the first film is a dummy gate layer. In an embodiment, the method further includes replacing the first film with a metal film after patterning the first film.

In an embodiment, a method of forming a semiconductor device is provided. The method includes forming a first film over an active region of a first side of a semiconductor substrate and a second film over a second side of the semiconductor substrate opposing to the first side of the semiconductor substrate in a same process; applying a first chemical mechanical polishing to planarize the second film; after applying the first chemical mechanical polishing, patterning the first film to form a dummy gate structure; and replacing the dummy gate structure with a metal gate structure. In an embodiment, a thickness of the second film after being planarized is smaller than a thickness of the metal gate structure. In an embodiment, replacing the dummy gate structure includes forming spacers adjacent to the dummy gate structure; removing the dummy gate structure to form an opening defined by the spacers; depositing a metal film in the opening and over the spacers; applying a second chemical mechanical polishing to remove a portion of the metal film over the spacers; and recessing the metal film in the opening. In an embodiment, patterning the first film includes defining a pattern of the first film by an extreme ultraviolet radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming a first film over an active region of a first side of a semiconductor substrate and a second film over a second side of the semiconductor substrate opposing to the first side of the semiconductor substrate;

before forming the first film and the second film, forming a third film over the active region over the first side of the semiconductor substrate and a fourth film over the second side of the semiconductor substrate, wherein the third film and the fourth film are formed in a same process;

applying a chemical mechanical polishing to remove at least a portion of the second film;

after applying the chemical mechanical polishing, forming a photoresist layer over the first film; and patterning the photoresist layer using an extreme ultraviolet radiation.

2. The method of claim 1, wherein the first film and the second film are formed in a same process.

3. The method of claim 1, wherein the first film and second film are formed by a thermal growth process or atomic layer deposition.

4. The method of claim 1, wherein the first film is a dummy gate layer.

5. The method of claim 1, further comprising etching the first film after patterning the photoresist layer.

6. The method of claim 1, wherein the first film and the second film comprise polycrystalline silicon, polycrystalline silicon germanium, silicon nitride, silicon oxide, silicon oxynitride, silicon oxygen carbon nitride, silicon carbon nitride, or a combination thereof.

7. The method of claim 1, wherein the first film and the second film are formed in a same second process.

8. The method of claim 1, further comprising:
   forming a fifth film over the first film and a sixth film over the second film before forming the photoresist layer, wherein the fifth film and the sixth film are formed of a same material; and
   removing the sixth film before applying the chemical mechanical polishing.

9. The method of claim 8, wherein the sixth film is removed by an etching process.

10. A method of forming a semiconductor device, the method comprising:
   forming a plurality of fins over a first side of a semiconductor substrate;
   forming a first film over the fins and a second film over a second side of the semiconductor substrate opposing to the first side of the semiconductor substrate;
   applying a first chemical mechanical polishing to remove a first thickness from the second film;
   applying a second chemical mechanical polishing to remove a second thickness from the first film before patterning the first film, wherein the second thickness is greater than the first thickness; and
   patterning the first film.

11. The method of claim 10, wherein the first film is a dummy gate material.

12. The method of claim 11, wherein the first film and the second film are formed simultaneously.

13. The method of claim 10, further comprising forming a third film over the first film and patterning the third film using an extreme ultraviolet radiation after applying the first chemical mechanical polishing.

14. The method of claim 10, further comprising:
   forming a fourth film over the first film and a fifth film over the second film; and
   removing the fifth film before patterning the first film.

15. The method of claim 10, wherein the first film is a dummy gate layer.

16. The method of claim 15, further comprising replacing the first film with a metal film after patterning the first film.

17. A method of forming a semiconductor device, comprising:
   forming a first film over an active region of a first side of a semiconductor substrate and a second film over a second side of the semiconductor substrate opposing to the first side of the semiconductor substrate in a same process;
   applying a first chemical mechanical polishing to planarize the second film;
   after applying the first chemical mechanical polishing, patterning the first film to form a dummy gate structure; and
   replacing the dummy gate structure with a metal gate structure, wherein a thickness of the second film after being planarized is smaller than a thickness of the metal gate structure.

18. The method of claim 17, further comprising forming a patterning layer over the active region and simultaneously forming a backside film over the second side of the semiconductor substrate before forming the first film, and patterning the substrate using the patterning layer as an etch mask.

19. The method of claim 17, wherein replacing the dummy gate structure comprises:
   forming spacers adjacent to the dummy gate structure;
   removing the dummy gate structure to form an opening defined by the spacers;
   depositing a metal film in the opening and over the spacers;
   applying a second chemical mechanical polishing to remove a portion of the metal film over the spacers; and
   recessing the metal film in the opening.

20. The method of claim 17, wherein patterning the first film comprises defining a pattern of the dummy gate structure by an extreme ultraviolet radiation.

* * * * *